(12) United States Patent
Seno

(10) Patent No.: US 7,904,856 B2
(45) Date of Patent: Mar. 8, 2011

(54) ARRANGEMENT HANDLING COMMANDS AS CONTROL SYSTEM BEHAVIORS AND DATA SYSTEM BEHAVIORS

(75) Inventor: Shuntaro Seno, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 553 days.

(21) Appl. No.: 11/970,568

(22) Filed: Jan. 8, 2008

(65) Prior Publication Data

US 2009/0031276 A1    Jan. 29, 2009

(30) Foreign Application Priority Data

Jul. 27, 2007  (JP) ................. 2007-196228

(51) Int. Cl.
    G06F 9/45    (2006.01)
    G06F 17/50   (2006.01)
(52) U.S. Cl. ......................... 716/104; 716/103
(58) Field of Classification Search ............... 716/3, 18
    See application file for complete search history.

(56) References Cited

U.S. PATENT DOCUMENTS

| | | | | |
|---|---|---|---|---|
| 6,360,355 | B1* | 3/2002 | Nishida et al. | 716/18 |
| 6,728,945 | B1* | 4/2004 | Wang | 716/18 |
| 7,143,367 | B2* | 11/2006 | Eng | 716/2 |
| 7,305,650 | B1* | 12/2007 | Jensen | 716/18 |
| 2001/0011363 | A1* | 8/2001 | Nishida et al. | 716/18 |
| 2002/0053069 | A1* | 5/2002 | Ohnishi et al. | 716/18 |
| 2003/0126580 | A1* | 7/2003 | Kurokawa et al. | 716/18 |
| 2005/0125762 | A1* | 6/2005 | Hattori et al. | 716/18 |
| 2005/0144585 | A1* | 6/2005 | Daw et al. | 716/18 |
| 2005/0198606 | A1* | 9/2005 | Gupta et al. | 716/18 |
| 2006/0053396 | A1* | 3/2006 | Eng | 716/7 |
| 2006/0225022 | A1* | 10/2006 | Ezaki | 716/18 |

FOREIGN PATENT DOCUMENTS

JP    2007-42085    2/2007

* cited by examiner

*Primary Examiner* — Stacy A Whitmore

(74) *Attorney, Agent, or Firm* — Antonelli, Terry, Stout & Kraus, LLP.

(57) ABSTRACT

A design apparatus, a design method, and a program, which enable the design of a small-scale circuit that is high in serviceability and quality are provided. Plural commands described at a behavior level are separated into control system behaviors that are behaviors concerning control and data system behaviors that are behaviors concerning data transfer, the data system behaviors for the commands are integrated into one or more behaviors, and both the control system behaviors for the commands and the behavior obtained by integrating the data system behaviors for the commands are subjected to high-level synthesis.

2 Claims, 41 Drawing Sheets

FIG.15

| COMMAND LAYER | SCOPE | VARIABLE NAME | TYPE | INITIAL VALUE | DATA PATH EXCLUSION FLAG |
|---|---|---|---|---|---|
| CMDA | Unit | CMD | xxx | yyy | TRUE |
| CMDA | Unit | CNT | xxx | yyy | TRUE |
| CMDA | Unit | DIN0 | xxx | yyy | TRUE |
| CMDA | Unit | DIN1 | xxx | yyy | TRUE |
| CMDA | Unit | WTDT | xxx | yyy | TRUE |
| CMDA | S0 | REQ | xxx | yyy | TRUE |
| CMDA | S1 | arb_ack | xxx | yyy | TRUE |
| CMDA | S2 | VLD | xxx | yyy | TRUE |
| CMDA | S4 | REQ | xxx | yyy | TRUE |
| CMDB | Unit | CMD | xxx | yyy | TRUE |
| CMDB | Unit | CNT | xxx | yyy | TRUE |
| CMDB | Unit | DIN2 | xxx | yyy | TRUE |
| CMDB | Unit | DIN3 | xxx | yyy | TRUE |
| CMDB | Unit | WTDT | xxx | yyy | TRUE |
| CMDB | S0 | REQ | xxx | yyy | TRUE |
| CMDB | S1 | arb_ack | xxx | yyy | TRUE |
| CMDB | S2 | VLD | xxx | yyy | TRUE |
| CMDB | S4 | REQ | xxx | yyy | TRUE |

| COMMAND LAYER | STATE NAME | DESTINATION CHANNEL NAME | TEMPORARY INPUT VARIABLE NAME | INPUT VARIABLE NAME | INPUT ATTRIBUTE | DESTINATION CHANNEL ATTRIBUTE | MESSAGE ATTRIBUTE | DATA PATH EXCLUSION FLAG |
|---|---|---|---|---|---|---|---|---|
| CMDA | S0 | REQ_0_rd | REQ | NONE | condition | share | | TRUE |
| CMDA | S0 | CMD_0_rd | CMD | NONE | input | share | | TRUE |
| CMDA | S1 | arb_ack_0_rd | arb_ack | NONE | condition | arb | | TRUE |
| CMDA | S2 | VLD_0_rd | VLD | NONE | condition | share | | TRUE |
| CMDA | S2 | DIN0_rd | DIN0 | NONE | input | normal | | TRUE |
| CMDA | S2 | DIN1_rd | DIN1 | NONE | input | normal | | TRUE |
| CMDA | S3 | REQ_0_rd | REQ | NONE | condition | share | | TRUE |
| CMDB | S0 | REQ_1_rd | REQ | NONE | condition | share | | TRUE |
| CMDB | S0 | CMD_1_rd | CMD | NONE | input | share | | TRUE |
| CMDB | S1 | arb_ack_1_rd | arb_ack | NONE | condition | arb | | TRUE |
| CMDB | S2 | VLD_1_rd | VLD | NONE | condition | share | | TRUE |
| CMDB | S2 | DIN2_rd | DIN2 | NONE | input | normal | | TRUE |
| CMDB | S2 | DIN3_rd | DIN3 | NONE | input | normal | | TRUE |
| CMDB | S3 | REQ_1_rd | REQ | NONE | condition | share | | TRUE |
| 91A | 91B | 91C | 91D | 91E | 91F | 91G | 91H | 91I |

| INPUT VARIABLE NAME | TABLE INPUT VALUE | | TEMPORARY INPUT VARIABLE NAME | TABLE OUTPUT VALUE | REMARKS |
| --- | --- | --- | --- | --- | --- |
| | INPUT ATTRIBUTE | DESTINATION CHANNEL ATTRIBUTE | | MESSAGE ATTRIBUTE | |
| NONE | input | arb | — | dummy | ARBITER MESSAGE DUMMY INPUT |
| NONE | input | share | — | dummy | PORT SHARE MESSAGE DUMMY INPUT |
| NONE | input | normal | — | dummy | NORMAL MESSAGE DUMMY INPUT |
| NONE | condition | arb | — | ctl | ARBITER MESSAGE FLAG POLLING |
| NONE | condition | share | — | ctl | PORT SHARE MESSAGE FLAG POLLING |
| NONE | condition | normal | — | ctl | NORMAL MESSAGE FLAG POLLING |
| !NONE | input | arb | — | ERROR HANDLING | EXCEPTION |
| !NONE | input | share | — | data | PORT SHARE MESSAGE ACTUAL INPUT |
| !NONE | input | normal | — | data | NORMAL MESSAGE ACTUAL INPUT |
| !NONE | condition | arb | — | ERROR HANDLING | EXCEPTION |
| !NONE | condition | share | — | ERROR HANDLING | EXCEPTION |
| !NONE | condition | normal | — | ERROR HANDLING | EXCEPTION |

FIG.18

| COMMAND LAYER | STATE NAME | STATE ACTION NAME | DESTINATION CHANNEL NAME | OUTPUT VARIABLE NAME | BIT SIZE | DESTINATION CHANNEL ATTRIBUTE | DESTINATION CHANNEL SUB-ATTRIBUTE | DESTINATION VARIABLE NAME | MESSAGE ATTRIBUTE | DATA PATH EXCLUSION FLAG |
|---|---|---|---|---|---|---|---|---|---|---|
| CMDA | ABTBEGIN | sa0 | arb_req_0 | | 1 | arb | arb | req | | TRUE |
| CMDA | S1 | sa0 | ACK_0_wd | | 1 | share | data | ACK | | TRUE |
| CMDA | S1 | sa0 | ACK_0_we | | 1 | share | en | ACK | | TRUE |
| CMDA | S1 | sa0 | WTEN_0_we | | 1 | share | en | WTEN | | TRUE |
| CMDA | S1 | sa0 | WTDT_0_we | | 1 | share | en | WTDT | | TRUE |
| | | | | | | | | | | |
| CMDB | ABTBEGIN | sa0 | arb_req_1 | | 1 | arb | arb | req | | TRUE |
| CMDB | S1 | sa0 | ACK_1_wd | | 1 | share | data | ACK | | TRUE |
| CMDB | S1 | sa0 | ACK_1_we | | 1 | share | en | ACK | | TRUE |
| CMDB | S1 | sa0 | WTEN_1_we | | 1 | share | en | WTEN | | TRUE |
| CMDB | S1 | sa0 | WTDT_1_we | | 1 | share | en | WTDT | | TRUE |
| | | | | | | | | | | |

| BIT SIZE | TABLE INPUT VALUE | | TABLE OUTPUT VALUE | |
|---|---|---|---|---|
| | DESTINATION CHANNEL ATTRIBUTE | DESTINATION CHANNEL SUB-ATTRIBUTE | MESSAGE ATTRIBUTE | DESTINATION VARIABLE NAME |
| 1 | arb | req | ctl | |
| 1 | share | data | ctl | |
| 1 | share | en | ctl | |
| 1 | normal | data | ctl | |
| >1 | arb | req | ERROR HANDING | |
| >1 | share | data | data | |
| >1 | share | en | ERROR HANDING | |
| >1 | normal | data | data | |

FIG.20

| COMMAND LAYER | STATE NAME | STATE ACTION NAME | PROCESSING ID | PROCESSING NODE | DATA PATH EXCLUSION FLAG |
|---|---|---|---|---|---|
| CMDA | S1 | sa0 | 0 | CNT = 0x08; | TRUE |
| CMDA | S2 | sa0 | 1 | WTDT = DIN0 + DIN1; | TRUE |
| CMDA | S2 | sa0 | 2 | CNT--; | TRUE |
| CMDB | S1 | sa0 | 3 | CNT = 0x08; | TRUE |
| CMDB | S2 | sa0 | 4 | WTDT = DIN2 + DIN3; | TRUE |
| CMDB | S2 | sa0 | 5 | CNT--; | TRUE |
| 93A | 93B | 93C | 93D | 93E | 93F |

| COMMAND LAYER | STATE NAME | STATE ACTION NAME | PROCESSING ID | PROCESSING NODE TOKEN ID | PROCESSING NODE TOKEN | DATA PATH EXCLUSION FLAG |
|---|---|---|---|---|---|---|
| CMDA | S1 | sa0 | 0 | 0 | CNT | TRUE |
| CMDA | S2 | sa0 | 1 | 1 | WTDT | TRUE |
| CMDA | S2 | sa0 | 1 | 2 | DIN0 | TRUE |
| CMDA | S2 | sa0 | 1 | 3 | DIN1 | TRUE |
| CMDA | S1 | sa0 | 2 | 4 | CNT | TRUE |
| CMDA | S2 | sa0 | 3 | 5 | CNT | TRUE |
| CMDA | S2 | sa0 | 4 | 6 | WTDT | TRUE |
| CMDA | S2 | sa0 | 4 | 7 | DIN2 | TRUE |
| CMDA | S2 | sa0 | 4 | 8 | DIN3 | TRUE |
| CMDA | S2 | sa0 | 5 | 9 | CNT | TRUE |
| 94A | 94B | 94C | 94D | 94E | 94F | 94G |

| COMMAND LAYER | STATE NAME | STATE ACTION NAME | TRANSITION CONDITION NODE ID | TRANSITION CONDITION NODE |
|---|---|---|---|---|
| CMDA | S0 | sa0 | 0 | CMD == 0x0A |
| CMDA | S2 | sa0 | 1 | CNT != 0x00 |
| CMDB | S0 | sa0 | 2 | CMD == 0x0B |
| CMDB | S2 | sa0 | 3 | CNT != 0x00 |
| 95A | 95B | 95C | 95D | 95E |

| COMMAND LAYER | STATE NAME | STATE ACTION NAME | TRANSITION CONDITION NODE ID | TRANSITION CONDITION NODE TOKEN ID | TRANSITION CONDITION NODE TOKEN |
|---|---|---|---|---|---|
| CMDA | S0 | sa0 | 0 | 0 | CMD |
| CMDA | S2 | sa0 | 1 | 1 | CNT |
| CMDB | S0 | sa0 | 2 | 2 | CMD |
| CMDB | S2 | sa0 | 3 | 3 | CNT |
| 96A | 96B | 96C | 96D | 96E | 96F |

96

FIG.26A (PROCESSING CODE)
WTDT = DIN0 + DIN1;
CNT—;

↓

FIG.26B (PROCESSING NODE) WTDT = DIN0 + DIN1;
(PROCESSING NODE) CNT—;

FIG.27A (PROCESSING NODE)
WTDT = DIN0 + DIN1;

↓

FIG.27B (INTERMEDIATE TOKEN) WTDT
(INTERMEDIATE TOKEN) =
(INTERMEDIATE TOKEN) DIN0
(INTERMEDIATE TOKEN) +
(INTERMEDIATE TOKEN) DIN1
(INTERMEDIATE TOKEN) ;

↓

FIG.27C (PROCESSING NODE TOKEN) WTDT
(PROCESSING NODE TOKEN) DIN0
(PROCESSING NODE TOKEN ) DIN1

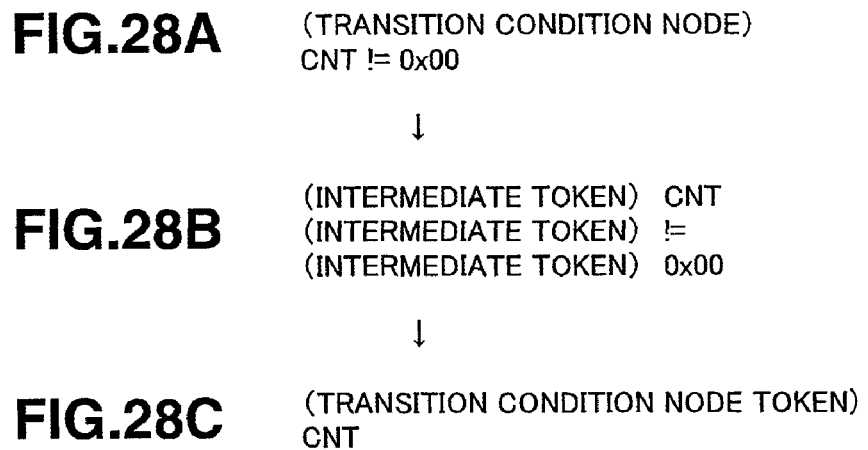
FIG.28A (TRANSITION CONDITION NODE)
CNT != 0x00
FIG.28B (INTERMEDIATE TOKEN) CNT
(INTERMEDIATE TOKEN) !=
(INTERMEDIATE TOKEN) 0x00
FIG.28C (TRANSITION CONDITION NODE TOKEN)
CNT
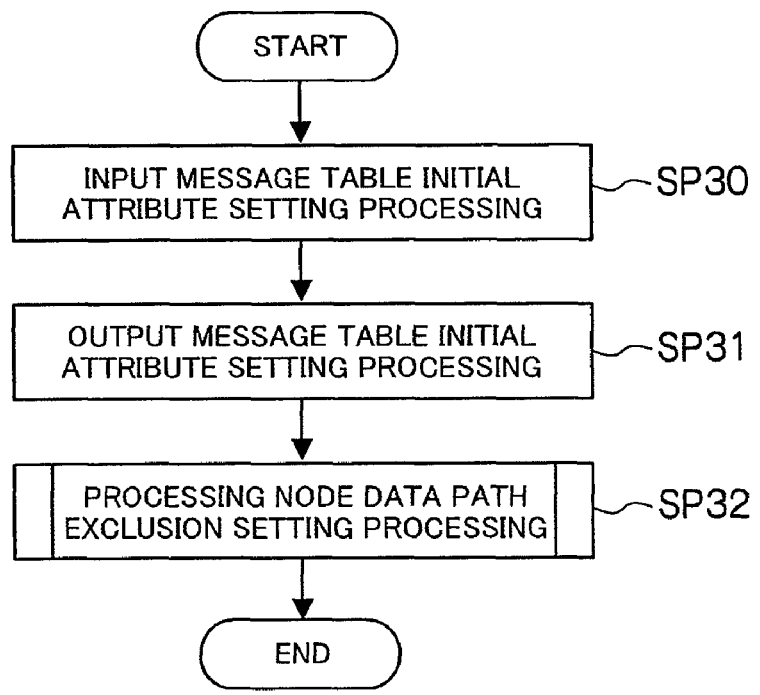
FIG.29

FIG. 31A

<LOCAL VARIABLE TABLE>

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL0 | XXX | YYY | TRUE |
| CMD0 | HUNIT | VAL1 | XXX | YYY | TRUE |
| CMD0 | AC_1 | TMP0 | XXX | YYY | TRUE |
| CMD0 | AC_1 | TMP1 | XXX | YYY | FALSE |

<INPUT MESSAGE TABLE> 91

| COMMAND LAYER | STATE NAME | DESTINATION CHANNEL NAME | TEMPORARY INPUT VARIABLE NAME | INPUT VARIABLE NAME | INPUT ATTRIBUTE | DESTINATION CHANNEL ATTRIBUTE | MESSAGE ATTRIBUTE | DATA PATH EXCLUSION FLAG |
|---|---|---|---|---|---|---|---|---|
| CMD0 | AC_1 | CHAN0 | TMP0 | VAL0 | INPUT | XXX | DATA | TRUE |
| CMD0 | AC_1 | CHAN1 | TMP1 | NULL | CONDITION | XXX | CTL | FALSE |
| CMD0 | AC_1 | CHAN2 | TMP2 | NULL | INPUT | XXX | DUMMY | TRUE |
| CMD0 | AC_1 | CHAN3 | TMP3 | NULL | INPUT | XXX | DUMMY | TRUE |

FIG. 31B

<LOCAL VARIABLE TABLE> 90

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL2 | XXX | YYY | TRUE |
| CMD0 | HUNIT | VAL3 | XXX | YYY | TRUE |
| CMD0 | AC_1 | TMP4 | XXX | YYY | TRUE |
| CMD0 | AC_1 | TMP5 | XXX | YYY | FALSE |

<OUTPUT MESSAGE TABLE> 92

| COMMAND LAYER | STATE NAME | STATE ACTION NAME | DESTINATION CHANNEL NAME | OUTPUT VARIABLE NAME | BIT SIZE | DESTINATION CHANNEL ATTRIBUTE | DESTINATION CHANNEL SUB-ATTRIBUTE | DESTINATION VARIABLE NAME | MESSAGE ATTRIBUTE | DATA PATH EXCLUSION FLAG |
|---|---|---|---|---|---|---|---|---|---|---|
| CMD0 | AC_1 | SA0 | CHAN4 | TMP4 | XXX | YYY | ZZZ | TTT | DATA | TRUE |
| CMD0 | AC_1 | SA0 | CHAN5 | TMP5 | XXX | YYY | ZZZ | TTT | CTL | FALSE |
| CMD0 | AC_1 | SA1 | CHAN6 | VAL2 | XXX | YYY | ZZZ | TTT | DATA | TRUE |
| CMD0 | AC_1 | SA2 | CHAN7 | VAL3 | XXX | YYY | ZZZ | TTT | DATA | TRUE |

FIG. 31C

<LOCAL VARIABLE TABLE> 90

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL4 | XXX | YYY | TRUE |
| CMD0 | HUNIT | VAL5 | XXX | YYY | TRUE |
| CMD0 | HUNIT | CND1 | XXX | YYY | FALSE |
| CMD0 | HUNIT | VAL6 | XXX | YYY | TRUE |

<TRANSITION CONDITION NODE TOKEN TABLE> 96

| COMMAND LAYER | STATE NAME | STATE ACTION NAME | TRANSITION CONDITION NODE ID | TRANSITION CONDITION NODE TOKEN |
|---|---|---|---|---|
| CMD0 | AC_1 | SA0 | XXXX | YYYY | CND0 |
| CMD0 | AC_1 | SA0 | XXXX | YYYY | CND1 |
| CMD0 | AC_1 | SA1 | XXXX | YYYY | CND2 |
| CMD0 | AC_1 | SA2 | XXXX | YYYY | CND3 |

FIG. 32A

<LOCAL VARIABLE TABLE> 90

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL0 | XXX | YYY | TRUE |
| CMD0 | HUNIT | VAL0 | XXX | YYY | TRUE |
| CMD0 | HUNIT | VAL0 | XXX | YYY | FALSE |
| CMD0 | HUNIT | VAL0 | XXX | YYY | TRUE |

<PROCESSING NODE TOKEN TABLE> 94

| COMMAND LAYER | STATE NAME | STATE ACTION NAME | PROCESSING NODE ID | PROCESSING NODE TOKEN ID | PROCESSING NODE TOKEN | DATA PATH EXCLUSION FLAG |
|---|---|---|---|---|---|---|
| CMD0 | AC_1 | SA0 | XXX | 0 | VAL0 | TRUE |
| CMD0 | AC_1 | SA0 | XXX | 1 | VAL1 | TRUE |
| CMD0 | AC_1 | SA1 | XXX | 2 | VAL2 | FALSE |
| CMD0 | AC_1 | SA1 | XXX | 3 | VAL1 | TRUE |

FIG. 32B

<PROCESSING NODE TOKEN TABLE> 94

| COMMAND LAYER | STATE NAME | STATE ACTION NAME | PROCESSING NODE ID | PROCESSING NODE TOKEN ID | PROCESSING NODE TOKEN | DATA PATH EXCLUSION FLAG |
|---|---|---|---|---|---|---|
| CMD0 | AC_1 | SA0 | | 0 | VAL0 | TRUE |
| CMD0 | AC_1 | SA0 | | 1 | VAL1 | TRUE |
| CMD0 | AC_1 | SA1 | | 2 | VAL2 | FALSE |
| CMD0 | AC_1 | SA1 | | 3 | VAL1 | TRUE |

<PROCESSING NODE TABLE> 93

| COMMAND LAYER | STATE NAME | STATE ACTION NAME | PROCESSING NODE ID | PROCESSING NODE | DATA PATH EXCLUSION FLAG |
|---|---|---|---|---|---|
| CMD0 | AC_1 | SA0 | 0 | VAL0 = 0; | TRUE |
| CMD0 | AC_1 | SA0 | 1 | VAL1 = 1; | TRUE |
| CMD0 | AC_1 | SA1 | 2 | VAL2 = V | FALSE |
| CMD0 | AC_1 | SA1 | 3 | VAL3 = 0; | TRUE |

FIG. 32C

<PROCESSING NODE TOKEN TABLE> 94

| COMMAND LAYER | STATE NAME | STATE ACTION NAME | PROCESSING NODE ID | PROCESSING NODE TOKEN ID | PROCESSING NODE TOKEN | DATA PATH EXCLUSION FLAG |
|---|---|---|---|---|---|---|
| CMD0 | AC_1 | SA0 | | 0 | VAL0 | TRUE |
| CMD0 | AC_1 | SA0 | | 1 | VAL1 | TRUE |
| CMD0 | AC_1 | SA1 | 2 | 2 | VAL2 | FALSE |
| CMD0 | AC_1 | SA1 | | 3 | VAL1 | FALSE |

<PROCESSING NODE TABLE> 93

| COMMAND LAYER | STATE NAME | STATE ACTION NAME | PROCESSING NODE ID | PROCESSING NODE | DATA PATH EXCLUSION FLAG |
|---|---|---|---|---|---|
| CMD0 | AC_1 | SA0 | 0 | VAL0 = 0; | TRUE |
| CMD0 | AC_1 | SA0 | 1 | VAL1 = 1; | TRUE |
| CMD0 | AC_1 | SA1 | 2 | VAL2 = VAL1; | FALSE |
| CMD0 | AC_1 | SA1 | 3 | VAL3 = 0; | TRUE |

FIG. 33A

<PROCESSING NODE TOKEN TABLE> 94

| COMMAND LAYER | STATE NAME | PROCESSING NODE ID | PROCESSING NODE TOKEN ID | STATE ACTION NAME | DATA PATH EXCLUSION FLAG |
|---|---|---|---|---|---|
| CMD0 | AC_1 | 0 | 0 | SA0 | TRUE |
| CMD0 | AC_1 | 1 | 1 | SA0 | TRUE |
| CMD0 | AC_1 | 2 | 2 | SA1 | FALSE |
| CMD0 | AC_1 | 2 | 3 | SA1 | FALSE |

<LOCAL VARIABLE TABLE> 90

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL0 | XXX | YYY | TRUE |
| CMD0 | HUNIT | VAL1 | XXX | YYY | TRUE |
| CMD0 | AC_1 | TMP0 | XXX | YYY | TRUE |
| CMD0 | AC_1 | TMP1 | XXX | YYY | FALSE |

<INPUT MESSAGE TABLE> 91

| COMMAND LAYER | STATE NAME | DESTINATION CHANNEL NAME | TEMPORARY INPUT VARIABLE NAME | INPUT VARIABLE NAME | INPUT ATTRIBUTE | DESTINATION CHANNEL ATTRIBUTE | MESSAGE ATTRIBUTE | DATA PATH EXCLUSION FLAG |
|---|---|---|---|---|---|---|---|---|
| CMD0 | AC_1 | CHAN0 | TMP0 | VAL0 | INPUT | XXX | DATA | TRUE |
| CMD0 | AC_1 | CHAN1 | TMP1 | NULL | CONDITION | XXX | CTL | FALSE |
| CMD0 | AC_1 | CHAN2 | TMP2 | VAL1 | INPUT | XXX | DUMMY | FALSE |
| CMD0 | AC_2 | CHAN2 | TMP3 | NULL | INPUT | XXX | DUMMY | FALSE |

FIG. 33B

<LOCAL VARIABLE TABLE> 90

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL0 | XXX | YYY | TRUE |
| CMD0 | HUNIT | VAL1 | XXX | YYY | FALSE |
| CMD0 | AC_1 | TMP0 | XXX | YYY | TRUE |
| CMD0 | AC_1 | TMP1 | XXX | YYY | FALSE |

<INPUT MESSAGE TABLE> 91

| COMMAND LAYER | STATE NAME | DESTINATION CHANNEL NAME | TEMPORARY INPUT VARIABLE NAME | INPUT VARIABLE NAME | INPUT ATTRIBUTE | DESTINATION CHANNEL ATTRIBUTE | MESSAGE ATTRIBUTE | DATA PATH EXCLUSION FLAG |
|---|---|---|---|---|---|---|---|---|
| CMD0 | AC_1 | CHAN0 | TMP0 | VAL0 | INPUT | XXX | DATA | TRUE |
| CMD0 | AC_1 | CHAN1 | TMP1 | NULL | CONDITION | XXX | CTL | FALSE |
| CMD0 | AC_1 | CHAN2 | TMP2 | VAL1 | INPUT | XXX | DUMMY | FALSE |
| CMD0 | AC_2 | CHAN2 | TMP3 | NULL | INPUT | XXX | DUMMY | FALSE |

FIG. 33C

<LOCAL VARIABLE TABLE> 90

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL0 | XXX | YYY | TRUE |
| CMD0 | HUNIT | VAL1 | XXX | YYY | FALSE |
| CMD0 | AC_2 | TMP2 | XXX | YYY | TRUE |
| CMD0 | AC_2 | TMP3 | XXX | YYY | FALSE |

FIG. 34A

<LOCAL VARIABLE TABLE>

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL0 | XXX | YYY | TRUE |
| CMD0 | HUNIT | VAL1 | XXX | YYY | FALSE |
| CMD0 | HUNIT | VAL2 | XXX | YYY | TRUE |
| CMD0 | HUNIT | VAL3 | XXX | YYY | FALSE |

<OUTPUT MESSAGE TABLE>

| COMMAND LAYER | STATE NAME | STATE ACTION NAME | DESTINATION CHANNEL NAME | OUTPUT VARIABLE NAME | BIT SIZE | DESTINATION CHANNEL ATTRIBUTE | DESTINATION CHANNEL SUB-ATTRIBUTE | DESTINATION VARIABLE NAME | MESSAGE ATTRIBUTE | DATA PATH EXCLUSION FLAG |
|---|---|---|---|---|---|---|---|---|---|---|
| CMD0 | AC_1 | SA0 | CHAN4 | TMP4 | XXX | YYY | ZZZ | TTT | DATA | TRUE |
| CMD0 | AC_1 | SA0 | CHAN5 | TMP5 | XXX | YYY | ZZZ | TTT | CTL | FALSE |
| CMD0 | AC_2 | SA1 | CHAN6 | VAL3 | XXX | YYY | ZZZ | TTT | DATA | TRUE |
| CMD0 | AC_3 | SA2 | CHAN6 | VAL4 | XXX | YYY | ZZZ | TTT | DATA | FALSE |

FIG. 34B

<LOCAL VARIABLE TABLE>

| COMMAND LAYER | SCOPE | VARIABLE NAME | TYPE | INITIAL VALUE | DATA PATH EXCLUSION FLAG |
|---|---|---|---|---|---|
| CMD0 | HUNIT | VAL0 | XXX | YYY | TRUE |
| CMD0 | HUNIT | VAL1 | XXX | YYY | FALSE |
| CMD0 | HUNIT | VAL2 | XXX | YYY | TRUE |
| CMD0 | HUNIT | VAL3 | XXX | YYY | FALSE |
| CMD0 | HUNIT | VAL4 | XXX | YYY | FALSE |

<OUTPUT MESSAGE TABLE>

| COMMAND LAYER | STATE NAME | STATE ACTION NAME | DESTINATION CHANNEL NAME | OUTPUT VARIABLE NAME | BIT SIZE | DESTINATION CHANNEL ATTRIBUTE | DESTINATION CHANNEL SUB-ATTRIBUTE | DESTINATION VARIABLE NAME | MESSAGE ATTRIBUTE | DATA PATH EXCLUSION FLAG |
|---|---|---|---|---|---|---|---|---|---|---|
| CMD0 | AC_1 | SA0 | CHAN4 | TMP4 | XXX | YYY | ZZZ | TTT | DATA | TRUE |
| CMD0 | AC_1 | SA0 | CHAN5 | TMP5 | XXX | YYY | ZZZ | TTT | CTL | FALSE |
| CMD0 | AC_2 | SA1 | CHAN6 | VAL3 | XXX | YYY | ZZZ | TTT | DATA | FALSE |
| CMD0 | AC_3 | SA2 | CHAN6 | VAL4 | XXX | YYY | ZZZ | TTT | DATA | FALSE |

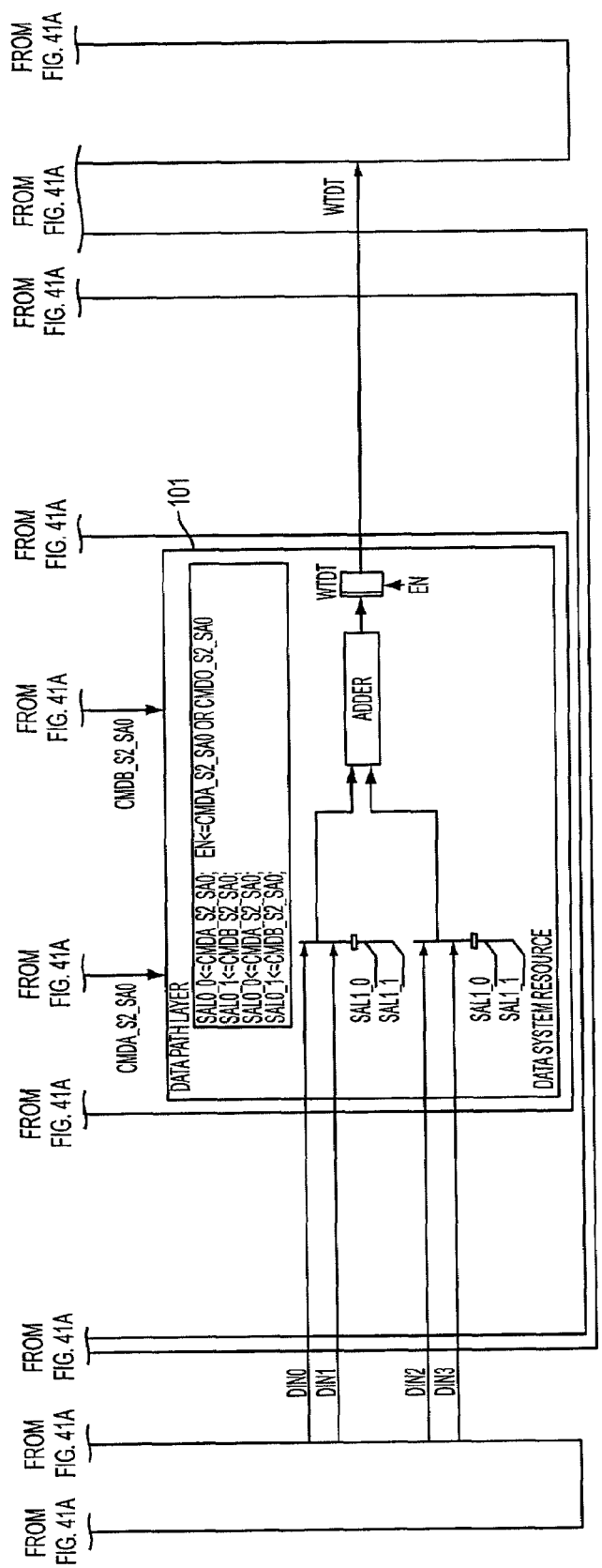

ARRANGEMENT HANDLING COMMANDS AS CONTROL SYSTEM BEHAVIORS AND DATA SYSTEM BEHAVIORS

CROSS-REFERENCES TO RELATED APPLICATIONS

This application relates to and claims priority from Japanese Patent Application No. 2007-196228, filed on Jul. 27, 2007, the entire disclosure of which is incorporated herein by reference.

BACKGROUND

1. Field of the Invention

The invention relates to a design apparatus, a design method, and a program, and is suitable for use in, for example, a design apparatus and a design method for designing a LSI (Large Scale Integration) logical circuit used in a storage apparatus.

2. Description of Related Art

The design of an LSI logical circuit has been conventionally conducted based on abstractness of RTL (Register Transfer Level) and by using a state transition diagram for performing data flow control. RTL indicates the abstractness for LSI design. Data flow is described on a register-register basis. For the RTL description, HDL (Hardware Description Language) with low abstractness such as VHDL (VHSIC Hardware Description Language) or Verilog-HDL is employed. The HDL source codes described at RTL are then converted into a circuit diagram called a net list, on which IC (Integrated Circuit) cells are connected to one another, by using software called a logic synthesis tool.

In the above-described LSI design work using the state transition diagram, the states of the transition flow need to be manually examined one by one after the formation of the state transition diagram. In the case of a high-performance LSI for a storage apparatus, the states and conditions of a state machine, which are described in a state transition diagram (FSM: Finite State Machine), increase in number because of complicated data flow specifications. Therefore, in such LSI design work, the design quality is easily reduced due to examination failures regarding the state transition flow, bug incorporation, or the like, leading to the problem of an increase in "loss" costs due to LSI reproduction.

Meanwhile, in recent years, a method of raising abstractness from the RTL to a behavior level where an action is extracted for each command (see, e.g., JP2007-042085 A) has been introduced for the purpose of improving quality and productivity. In LSI design using the behavior level, commands are described by using a high-level language such as the C language or System C (extended C language). The commands described at the behavior level are then converted into HDL source codes described at RTL by using software called a high-level synthesis tool, and the source codes are converted into a net list (circuit diagram) by using a logic synthesis tool.

Incidentally, high-level synthesis used for behavior-level design has had a problem (first problem) that a data path circuit is created for each command, leading to larger circuit scale and higher cost compared with a conventional RTL-based setting method. The high-level synthesis also has had a problem (second problem) that circuit resource sharing is mechanically conducted, not allowing practical resource sharing control, in which control system resources and data system resources are separated from each other, to occur.

In a general high-level synthetic algorithm, a pair of a state machine and a data path is created for one behavior (flow of a series of steps in hardware). In high-level synthesis processing, resource sharing is conducted in a data path, and therefore, a circuit scale can be reduced compared with the conventional design method with respect to one command.

However, regarding the first problem, resource sharing cannot be conducted over plural pairs of state machines and data paths in conventional high-level synthesis processing, and therefore, data path circuits are created corresponding to the increase in the number of commands. An LSI for a computer typified by a storage apparatus has a feature where plural orders are executed on a single data path, and accordingly, has been inadequate for high-level synthesis in terms of circuit scale and cost.

Regarding the second problem, in general logic design, logic circuits for conducting control such as a counter circuit and a comparator are regarded as control system resources, and logic circuits specialized for data transfer such as a data register, an address resister, and a data calculator are regarded as data system resources; and the control system resources and the data system resources are separated during design. This is because the separation of the control system resources and the data system resources enhances the readability and serviceability in circuit configuration so that control is not involved in failures such as a data error. There is also the reason that control system logic consists of a relatively small circuit, leading to a low circuit scale reduction effect in resource sharing.

Meanwhile, in high-level processing, parts other than state machines are mechanically subjected to resource sharing, and therefore, a circuit in which control system resources and data system resources are mixed is created. This presents a problem in that the RTL created through high-level synthesis is inferior to the RTL created by a conventional RTL design method in terms of readability or serviceability, or circuit quality.

SUMMARY

The present invention has been made in light of the above, and an object of the invention is to provide a design apparatus, a design method, and a program that enable the design of a small-scale circuit that is high in serviceability and quality.

In order to solve the above-mentioned problems, according to the invention, provided is a design apparatus for designing a circuit, having: a command separation unit for separating plural commands described at a behavior level into control system behaviors that are behaviors concerning control and data system behaviors that are behaviors concerning data transfer; an integration unit for integrating the data system behaviors for the commands into one or more behaviors; and a high-level synthesis processing unit for subjecting both of the control system behaviors for the commands and the behavior obtained by integrating the data system behaviors for the commands to high-level synthesis.

Moreover, according to the invention, there is provided a design method for designing a circuit, having: a first step of separating plural commands described at a behavior level into control system behaviors that are behaviors concerning control and data system behaviors that are behaviors concerning data transfer; a second step of integrating the data system behaviors for the commands into one or more behaviors; and a third step of subjecting both of the control system behaviors for the commands and the behavior obtained by integrating the data system behaviors for the commands to high-level synthesis.

Furthermore, according to the invention, provided is a program for having a computer execute processing including: a first step of separating plural commands described at a behavior level into control system behaviors that are behaviors concerning control and data system behaviors that are behaviors concerning data transfer; a second step of integrating the data system behaviors for the commands into one or more behaviors; and a third step of subjecting both of the control system behaviors for the commands and the behavior obtained by integrating the data system behaviors for the commands to high-level synthesis.

According to the invention, a design is employed in which control system resources such as a counter circuit and a comparator and data system resources such as a data register, an address register, and a data calculator are separately provided. Accordingly, the readability and serviceability of the finally obtained circuit configuration are enhanced, enabling high-quality circuit design.

Also, according to the invention, data system behaviors for commands, which have been separated from control system behaviors, are integrated into one behavior, and therefore, resource sharing in data path logic can be performed over plural state machines. Accordingly, the scale of the finally obtained circuit configuration can be reduced markedly.

BRIEF DESCRIPTION OF THE DRAWINGS

FIG. 15 is a chart showing a local variable table.

FIG. 16 is a chart showing an input message table.

FIG. 17 is a chart showing a message attribute determination specification for an input message table.

FIG. 18 is a chart showing an output message table.

FIG. 19 is a chart showing a message attribute determination specification for an output message table.

FIG. 20 is a chart showing a processing node table.

FIG. 21 is a chart showing a processing node token table.

FIG. 22 is a chart showing a transition condition node table.

FIG. 23 is a chart showing a transition condition node token table.

FIGS. 26A to 26B are diagrams for the explanation of initialization processing for a processing node table.

FIGS. 27A to 27C are diagrams for the explanation of initialization processing for a processing node token table.

FIGS. 28A to 28C are diagrams for the explanation of initialization processing for a transition condition node token table.

FIG. 29 is a flowchart for the explanation of data path exclusion setting processing.

FIGS. 31A to 31C are conceptual diagrams for the explanation of processing node data path exclusion setting processing.

FIGS. 32A to 32C are conceptual diagrams for the explanation of processing node data path exclusion setting processing.

FIGS. 33A to 33C are conceptual diagrams for the explanation of processing node data path exclusion setting processing.

FIGS. 34A to 34B are conceptual diagrams for the explanation of processing node data path exclusion setting processing.

FIGS. 41A-B are conceptual diagrams for the explanation of the configuration obtained by subjecting the behavior model shown in FIG. 39 to high-level synthesis processing.

DETAILED DESCRIPTION OF PREFERRED EMBODIMENTS

An embodiment of the invention will be described in detail below with reference to the accompanying drawings.

(1) Configuration for Design Apparatus according to This Embodiment

Figure 1:
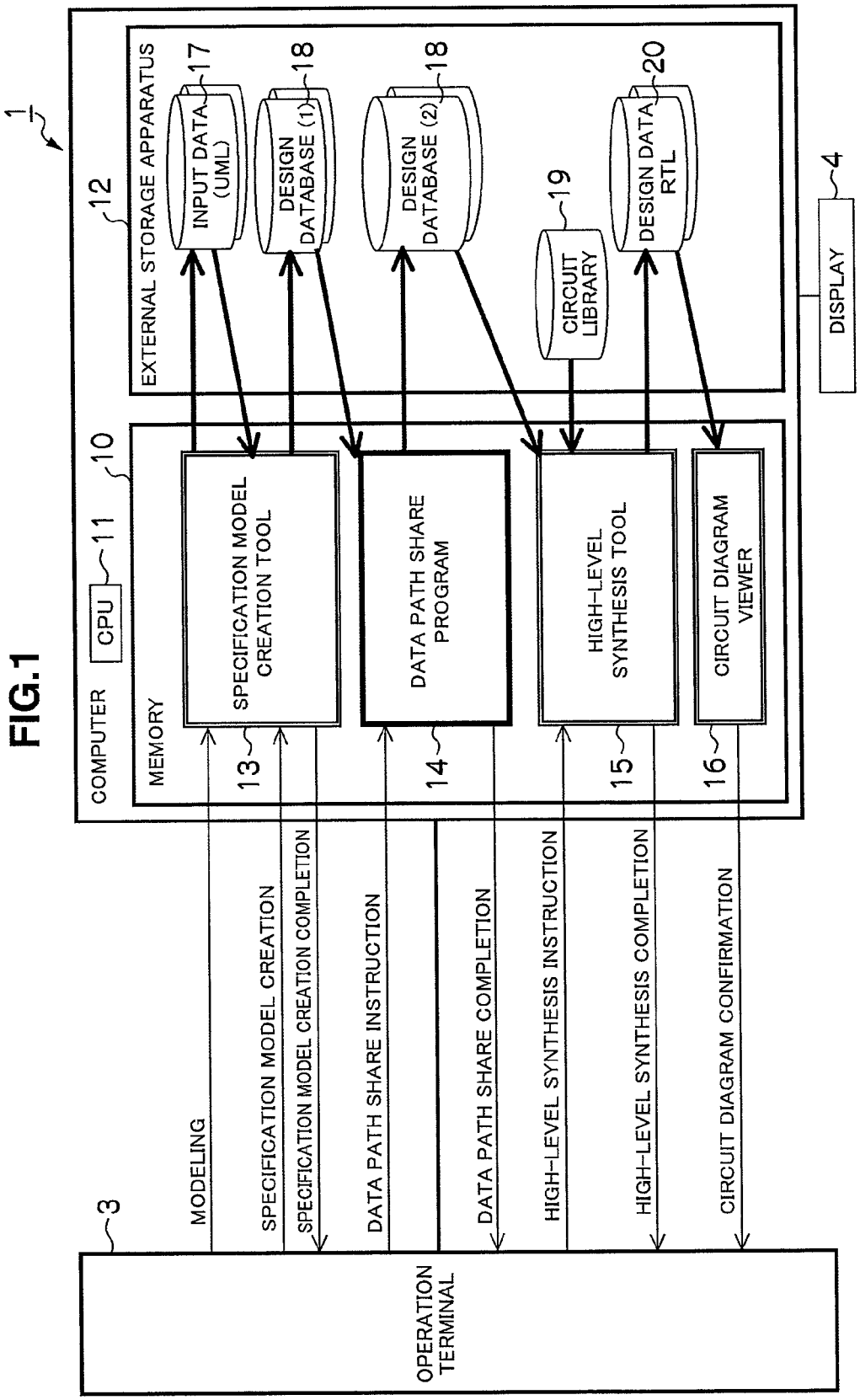
FIG. 1 is a block diagram showing a schematic configuration for an LSI design apparatus according to an embodiment of the invention.

In FIG. 1, reference numeral 1 denotes, as a whole, an LSI design apparatus according to an embodiment of the present invention. This LSI design apparatus 1 is suitable for the design of an LSI for a storage apparatus, and is composed of a computer main body 2, an operation terminal 3, and a display 4.

The computer main body 2 is provided with memory 10, a CPU (Central Processing Unit) 11, and an external storage apparatus 12.

The memory 10 is used mainly for holding tools for LSI design. Specifically, the memory 10 holds LSI design tools such as a specification model creation tool (spec authoring tool) 13, which is commercial software for creating a specification model as disclosed in, e.g., JP2007-042085 A; a data path share program 14 described later; a high-level synthesis tool 15, which is commercial software for executing high-level synthesis processing; and a circuit diagram viewer 16, which is commercial software for displaying a circuit diagram created by the high-level synthesis tool 15 on the display 4.

The CPU 11 is a processor for controlling the operation of the entire LSI design apparatus 1. The CPU 11 executes the LSI design tools stored in the memory 10 so that the entire LSI design apparatus 1 executes various kinds of processing described later. The external storage apparatus 12 is composed of, e.g., a hard disk drive, and stores various parameters used by the LSI design tools. The external storage apparatus 12 also holds input data 17 input by a designer, a design database 18 described later, a circuit library 19, design data 20, etc.

The operation terminal 3 is used by a user to operate the LSI design apparatus 1, and is composed of a keyboard, mouse, etc. Also, the display 4 is used for displaying various GUIs (Graphical User Interfaces) and information, and is configured by using a CRT (Cathode Ray Tube), liquid crystal, or similar.

Figure 2:
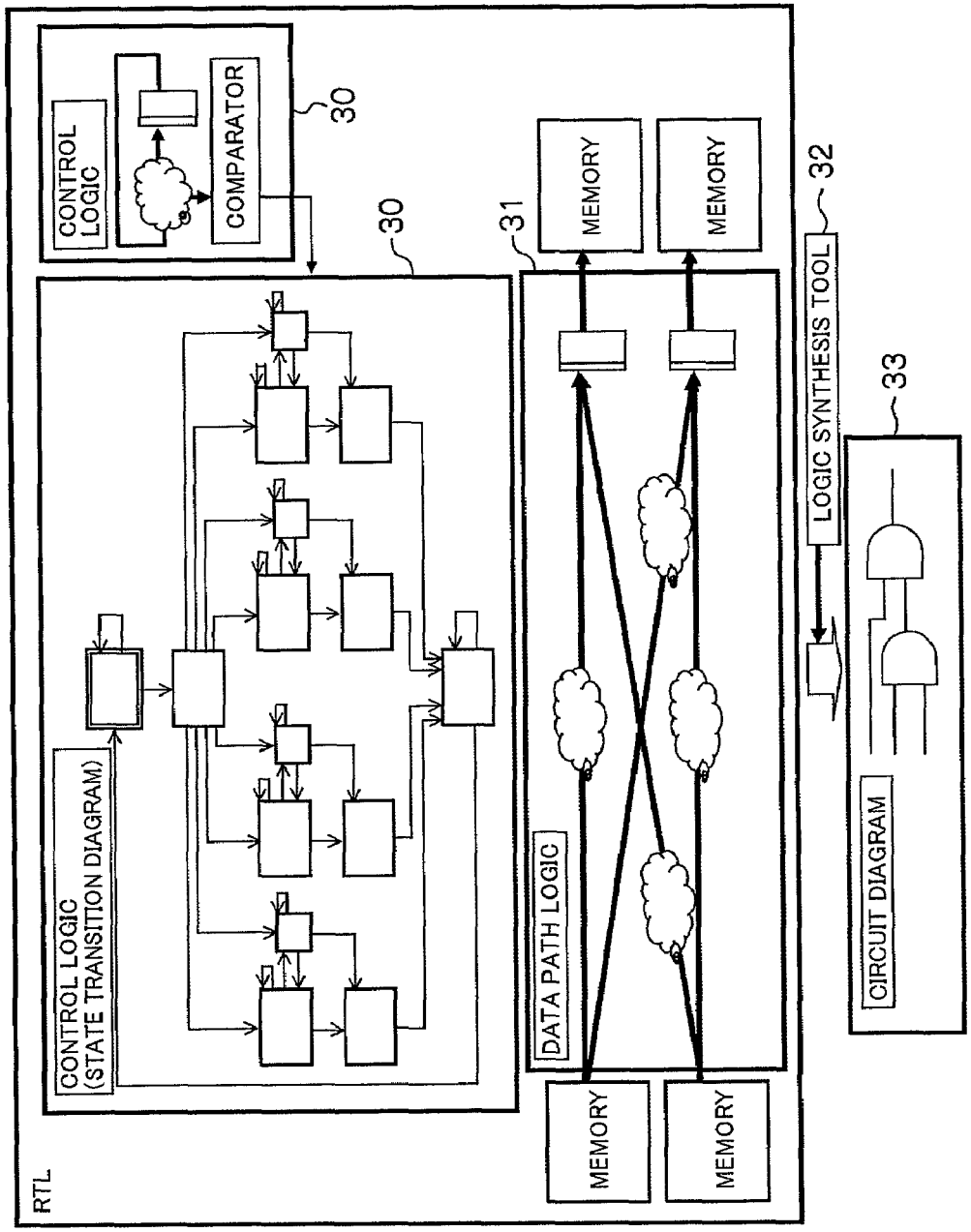
FIG. 2 is a conceptual diagram showing an outline of a conventional LSI design method using RTL.

(2) LSI Design Method According to This Embodiment (2-1) Outline of LSI Design Method According to This Embodiment FIG. 2 shows an outline of a conventional LSI design method using RTL. With this LSI design method, control logic 30 consisting of a state transition diagram and data path logic 31 consisting of data paths are created manually. The source codes in HDL described at RTL, which were obtained by the above operation, are converted into a net list 33 by using a logic synthesis tool 32.

Figure 3:
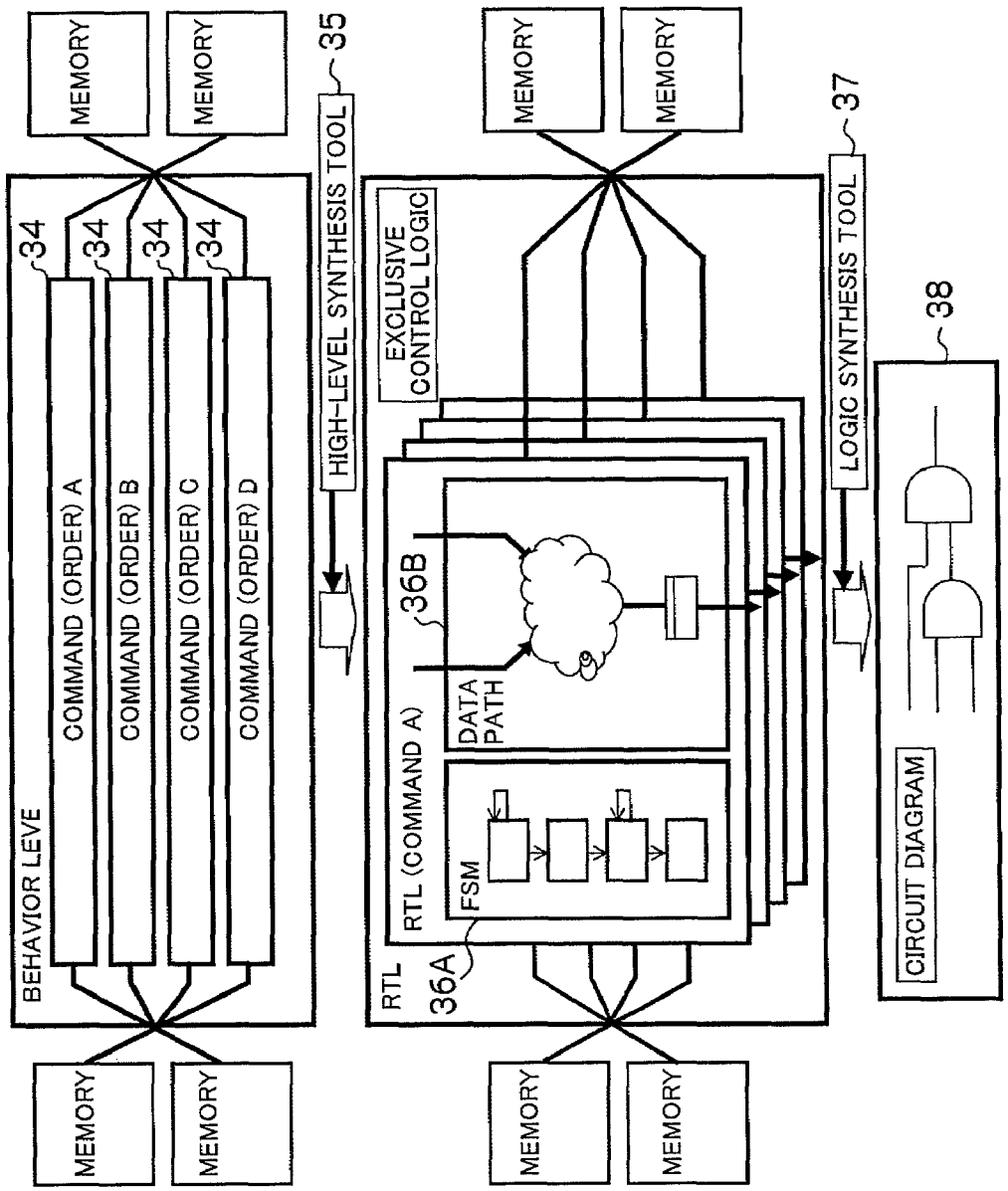
FIG. 3 is a conceptual diagram showing an outline of an LSI design method using a behavior level.

FIG. 3 shows an outline of an LSI design method using a behavior level. With this LSI design method, a data flow is described at the behavior level with plural commands 34 for exclusive operations. The commands 34 each are converted into control logic 36A and data path logic 36B, which are described at RTL, by using a high-level synthesis tool 35. Then, the control logic 36A and the data path logic 36B for each command 34 are converted into a net list 38 by using a logic synthesis tool 37.

Figure 4:
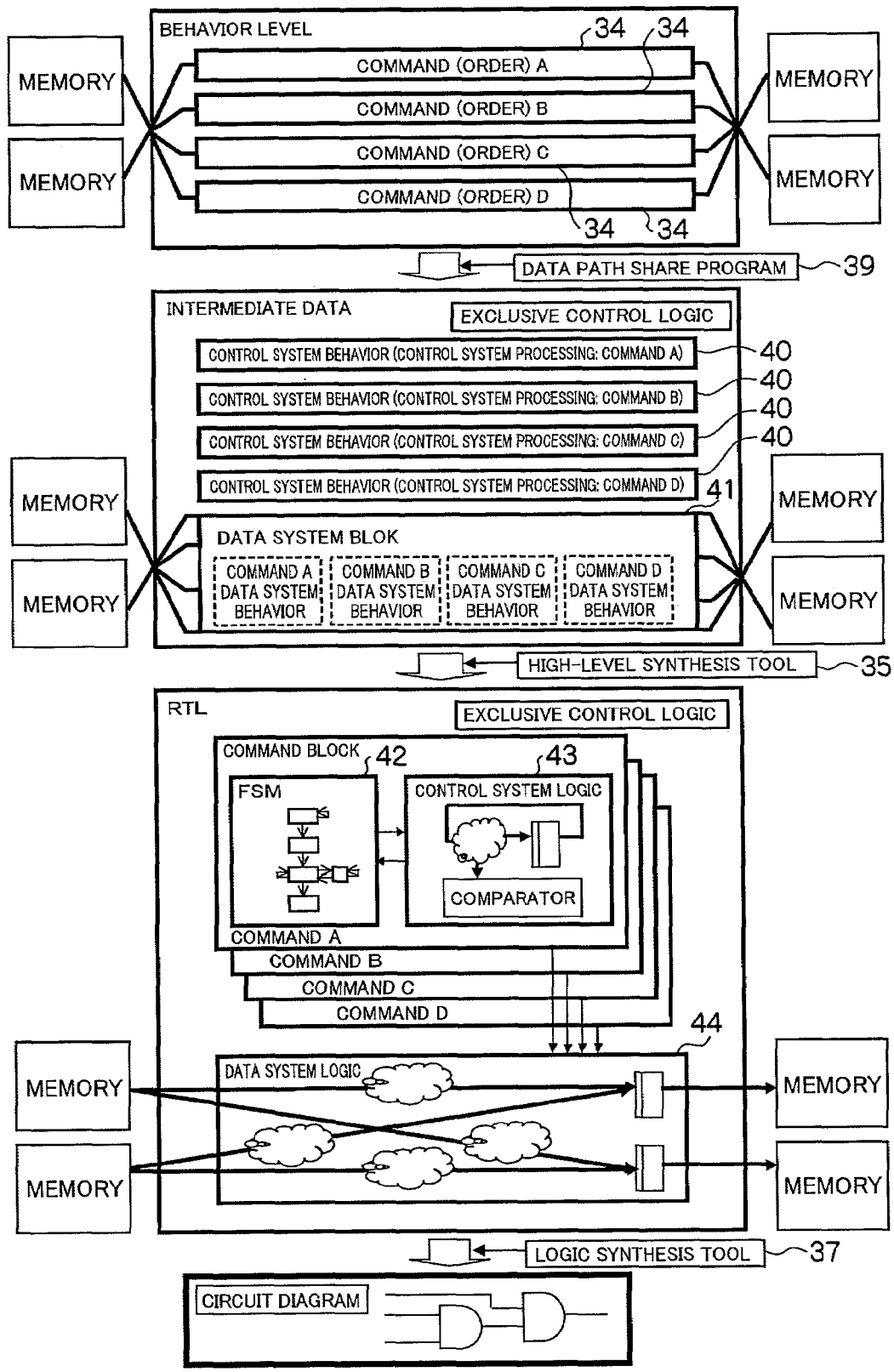
FIG. 4 is a conceptual diagram showing an outline of an LSI design method according to an embodiment of the invention.

Meanwhile, FIG. 4 shows an outline of an LSI design method according to this embodiment of the invention and has corresponding parts to those in FIG. 3 with the same reference numerals. The LSI design method according to this embodiment has basically the same algorithm as the above-described LSI design method using the behavior level. One of features of the LSI design method resides in executing, as preprocessing of high-level synthesis, processing in which each of the commands 34 is separated into a behavior on control (hereinafter referred to as "control system behavior") and a behavior on data transfer (hereinafter referred to as "data system behavior"); and the data system behaviors for the respective commands 34 are integrated into one behavior (hereinafter arbitrarily referred to as "data path layer") 41.

With the LSI design method according to this embodiment, the above-described control system behaviors for the commands (hereinafter arbitrarily referred to as "command layer") 40 and the data path layer 41 are respectively converted into control logic 42 and control system logic (control path) 43, and data system logic (data path) 44, which are described at the RTL, by using the high-synthesis tool 35. Then, the control logic 42 and the control system logic 43 for each command and the data system logic 44 are converted into a net list 45 by using a logic synthesis tool 37.

Figure 5:
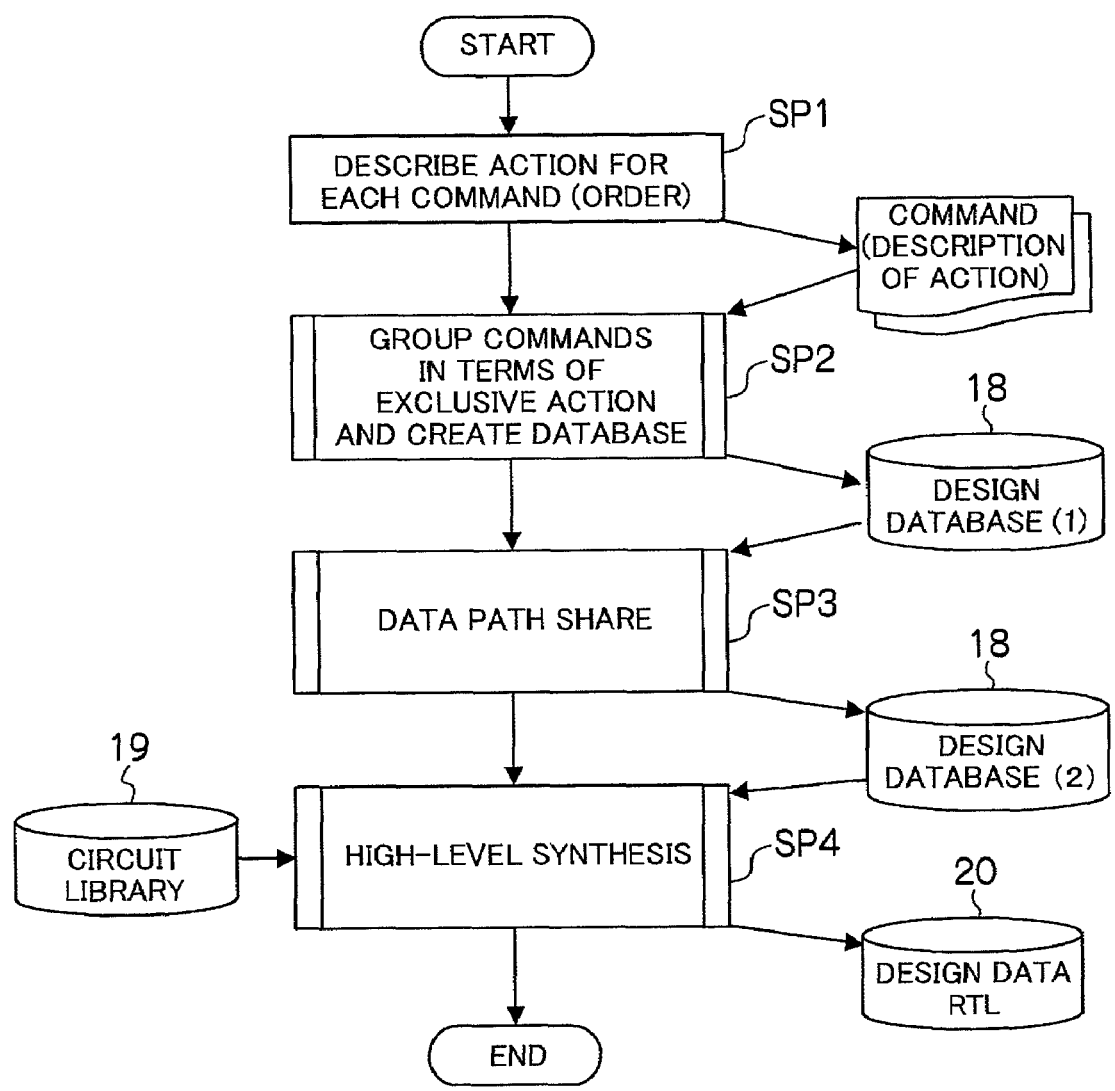
FIG. 5 is a flowchart showing the flow up to high-level synthesis processing in design work using an LSI design method according to an embodiment of the invention.

FIG. 5 shows the flow up to high-level synthesis processing in design work using the LSI design method according to this embodiment. In the design work using the LSI design method according to this embodiment, first, a designer describes each necessary command 34 at a behavior level by using the specification model creation tool 13 (FIG. 1) in the LSI design apparatus 1 (SP1). The designer then conducts grouping (port share or creation of exclusive logic (arbiter)) of the commands to create the design database 18 (SP2).

Subsequently, the designer starts the data path share program 14 (FIG. 1), and executes data path share processing as preprocessing of high-level synthesis. In this way, the LSI design apparatus 1 separates each of the commands into the control system behavior 40 and the data system behavior in accordance with the data path share program 14, and integrates the data behaviors for the commands into one behavior 41. The LSI design apparatus 1 updates the design database 18 in accordance with the new design data obtained through the above processing (SP3).

After that, the designer runs the high-synthesis tool 15 (FIG. 1) to execute high-level synthesis processing based on the design database 18 updated at step SP3 and the circuit library 19 preliminarily stored in the external storage apparatus 12 (FIG. 1) in the LSI design apparatus 1 (SP4).

Figure 6:
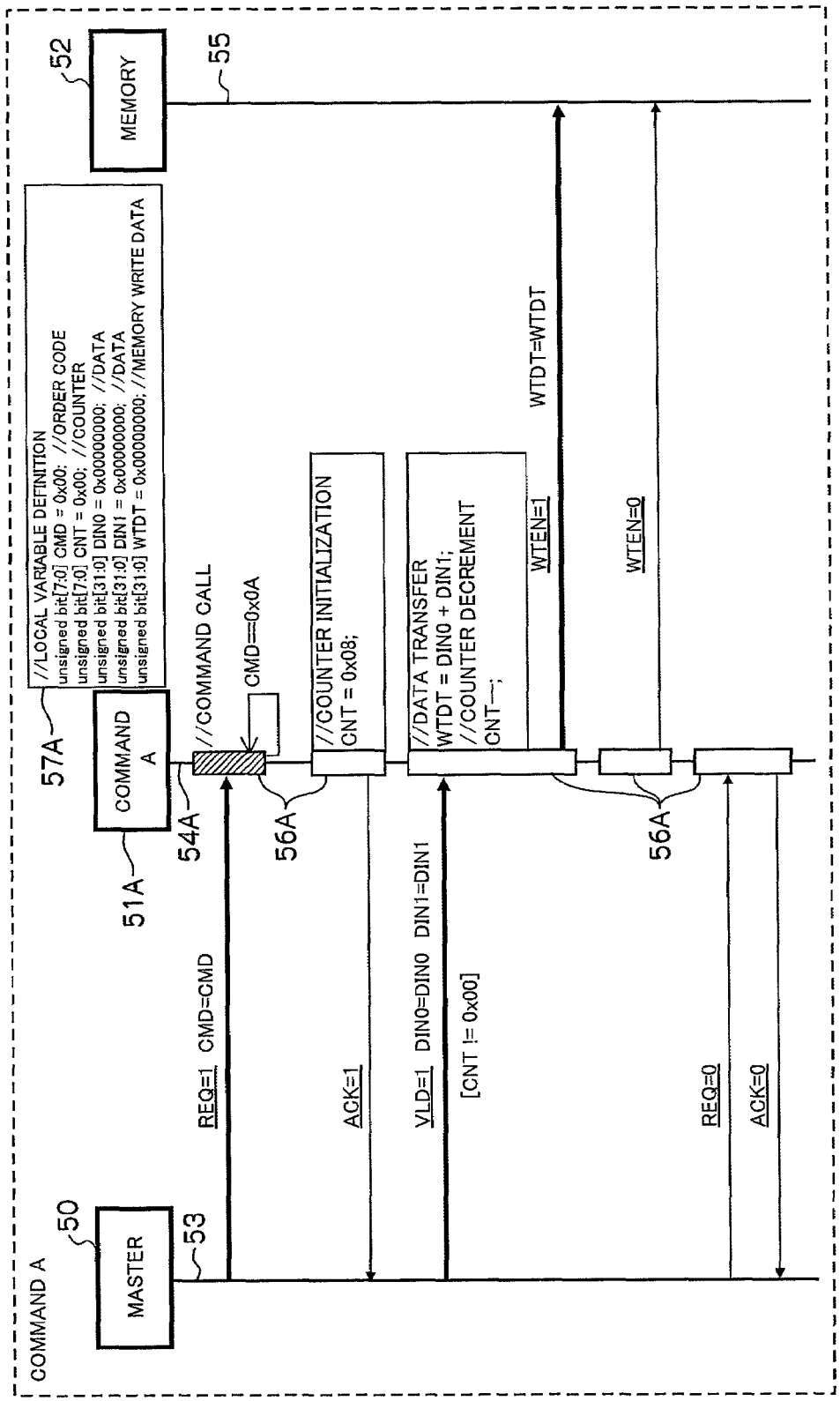
FIG. 6 is a sequence diagram showing a behavior model in UML notation.
Figure 7:
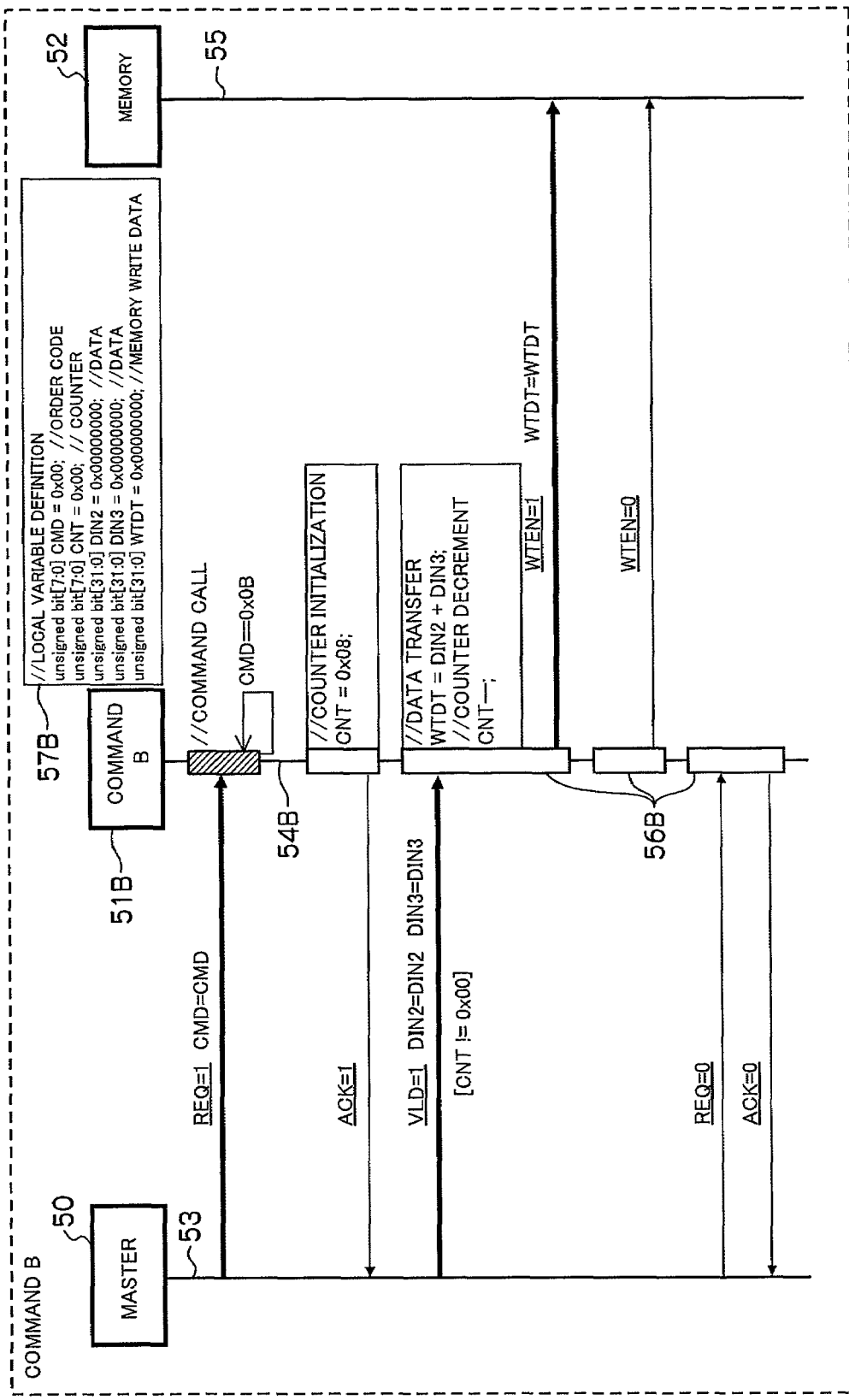
FIG. 7 is a sequence diagram showing a behavior model in UML notation.

FIGS. 6 and 7 each show an example of a behavior model created at step SP1 in FIG. 5. FIG. 6 shows, in UML (Unified Modeling Language) notation, a command ("command A") 51A that starts with an order code, "0x0A" from a master 50 and repeats processing of adding data DIN0 and data DIN1 given from the master 50 and writing the result in the memory 52 eight times. FIG. 7 shows, in UML notation, a command ("command B") 51B that starts with an order code, "0x0B" from the master 50 and repeats processing of adding data DIN2 and data DIN3 given from the master 50 and writing the result in the memory 52 eight times.

In FIGS. 6 and 7, activated symbols 56A and 56B disposed on lifelines 54A and 54B for the commands 51A and 51B indicate states in the commands 51A and 51B, respectively. The character strings described on the left side of the activated symbols 56A and 56B are called processing codes, and each code represents the content of the processing to be executed in the relevant state.

Moreover, the arrows pointing from a lifeline 53 for the master 50 to the activated symbols 56A and 56B for the commands 51A and 51B represent input messages to the commands 51A and 51B, respectively. The arrows pointing from the activated symbols 56A and 56B to the lifelines 53 and 55 for the master 50 and the memory 52 represent output messages from the commands 51A and 51B, respectively.

The underlined character strings of the character strings described on these arrows indicate flags, while the non-underlined character strings indicate variable-value transfer. Also, "[CNT!=0x00]" represents the condition in which the same action is repeated, and here indicates that the same action is repeated until the counter value becomes "0x00."

Refer to JP2007-042085 A with respect to the above-described UML notation for the behavior model. Incidentally, FIGS. 6 and 7 show local variables defined by a designer in the upper right frames 57A and 57B, respectively.

Figure 8:
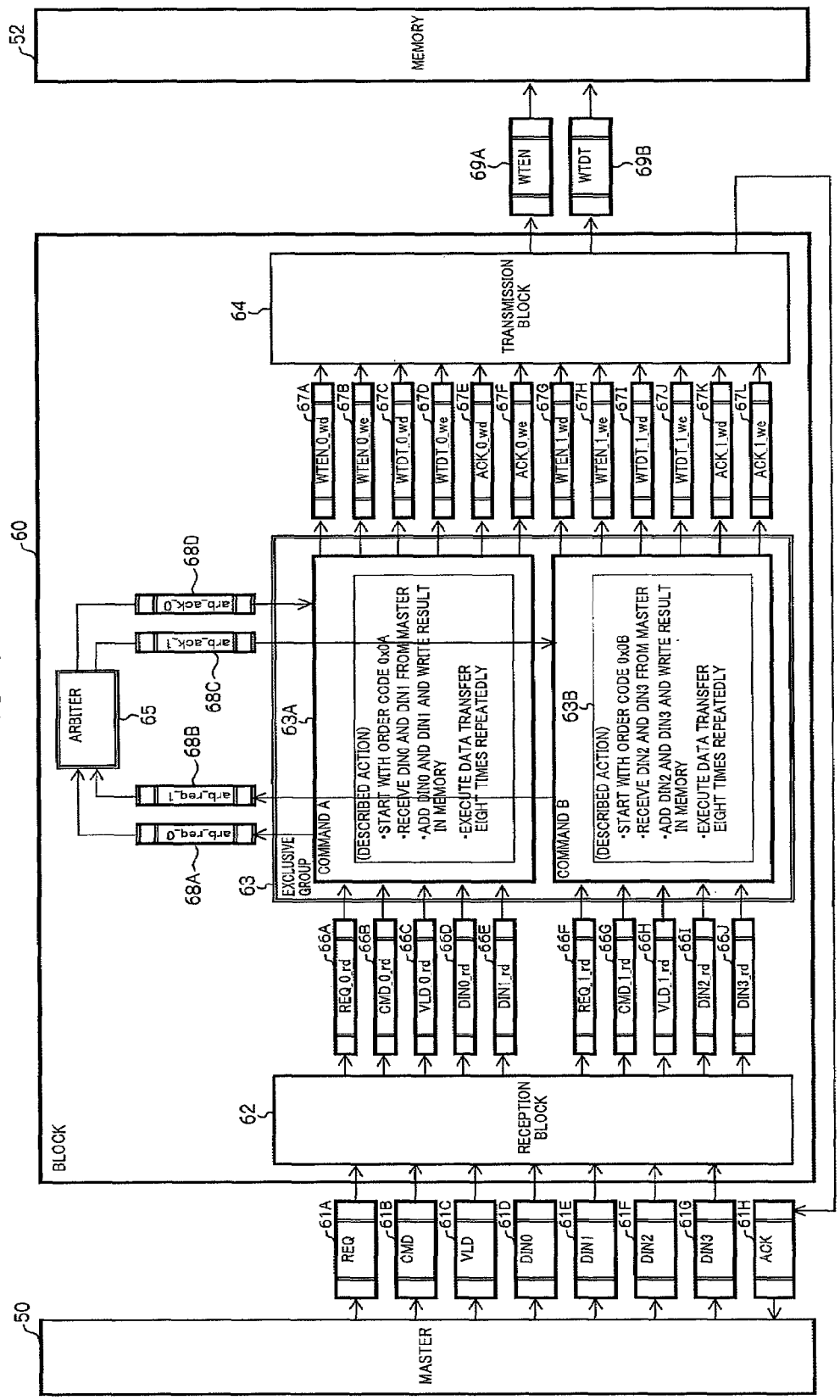
FIG. 8 is a conceptual diagram showing a configuration example of a behavior model on a design database 18.

FIG. 8 shows a configuration example of a behavior model on the design database 18, which is created by using the specification model creation tool 13 (FIG. 1) based on the behavior models in FIGS. 6 and 7. As shown in FIG. 8, in the behavior model on the design database 18, channels 61A to 61H are defined between the master 50 and a design-target block 60 so as to correspond to the variable values transferred between the master 50 and the block 60 (here, between the master 50 and "command A" and between the master 50 and "command B").

Defined in the block 60 are a reception block 62 for, e.g., sorting input messages; an exclusive group 63 composed of commands (here "command A" and "command B") 63A and 63B designed by a designer; a transmission block 64 for, e.g., conducting selection of output messages; and an arbiter 65 for conducting exclusive control between the command hierarchies 63A and 63B in the exclusive group 63.

Figure 9:
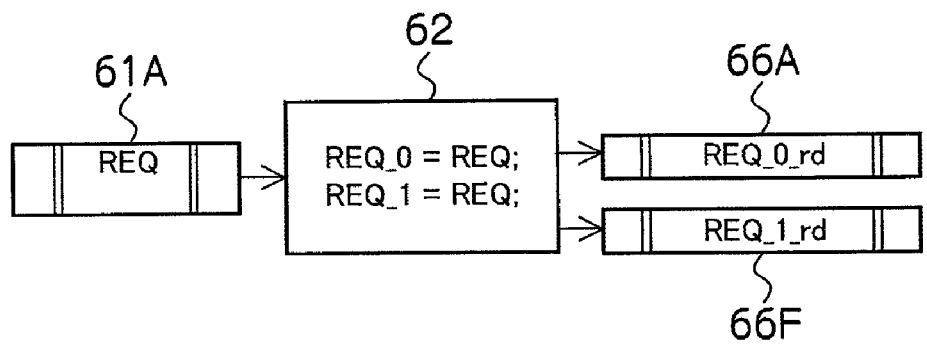
FIG. 9 is a conceptual diagram for the explanation of a reception block.
Figure 10:
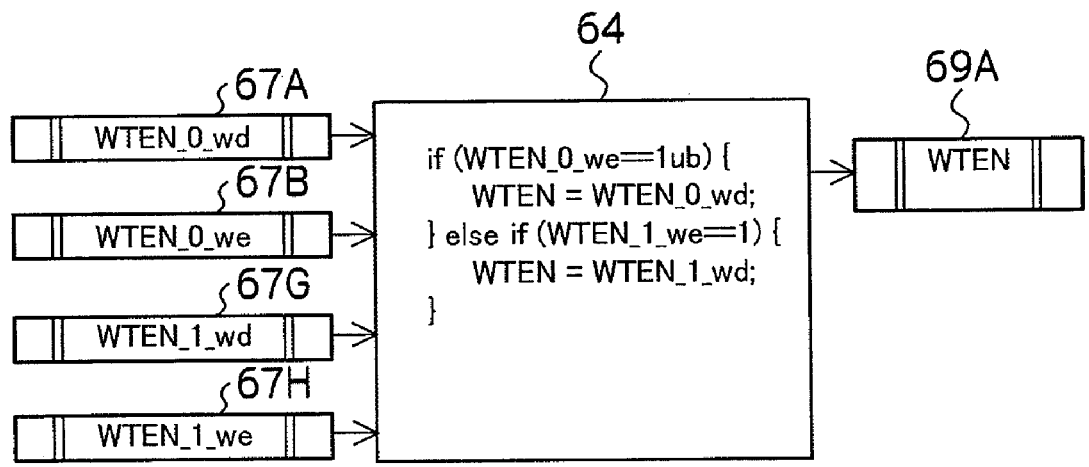
FIG. 10 is a conceptual diagram for the explanation of a transmission block.

Channels 66A to 66J are defined between the reception block 62 and the command hierarchies 63A and 63B in the exclusive group 63 SQ as to correspond to the variable values transferred between the master 50 and the command hierarchies 63A and 63B, and channels 67A to 67L are defined between the command hierarchies 63A and 63B and the transmission block 64 so as to correspond to the variable values transferred between the command hierarchies 63A and 63B and the memory 52. Also, channels 68A to 68D for transmission and reception are defined between the command hierarchies 63A and 63B and the arbiter 65, and channels 69A and 69B are defined between the transmission block 64 and the memory 52 so as to correspond to the variable values transferred between the command hierarchies 63A and 63B and the memory 52. Incidentally, the configuration for the reception block 62 and the transmission block 64 are shown in FIGS. 9 and 10, respectively.

Figure 11:
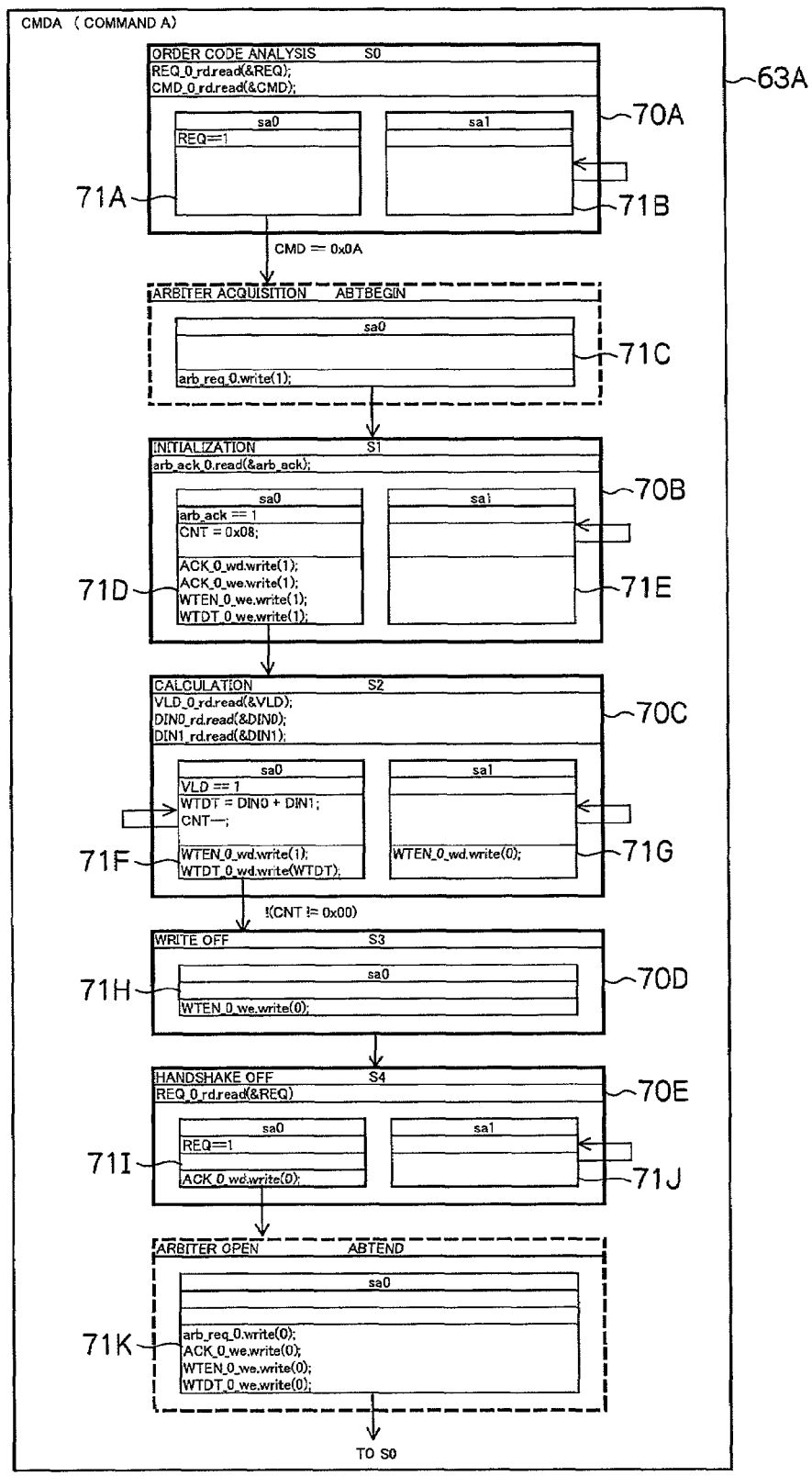
FIGS. 11A-B are state transition diagrams for the explanation of command A in FIG. 8.
Figure 11A:
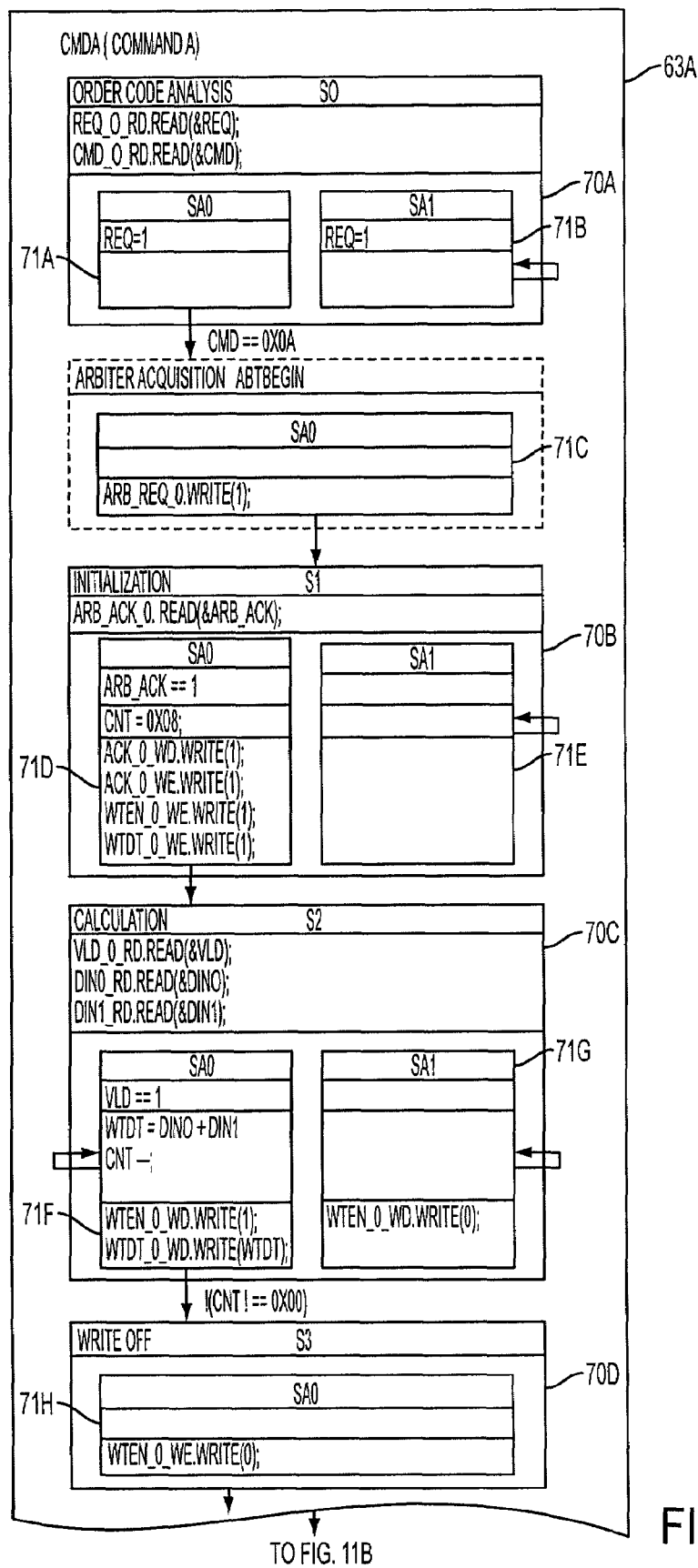
Figure 11B:
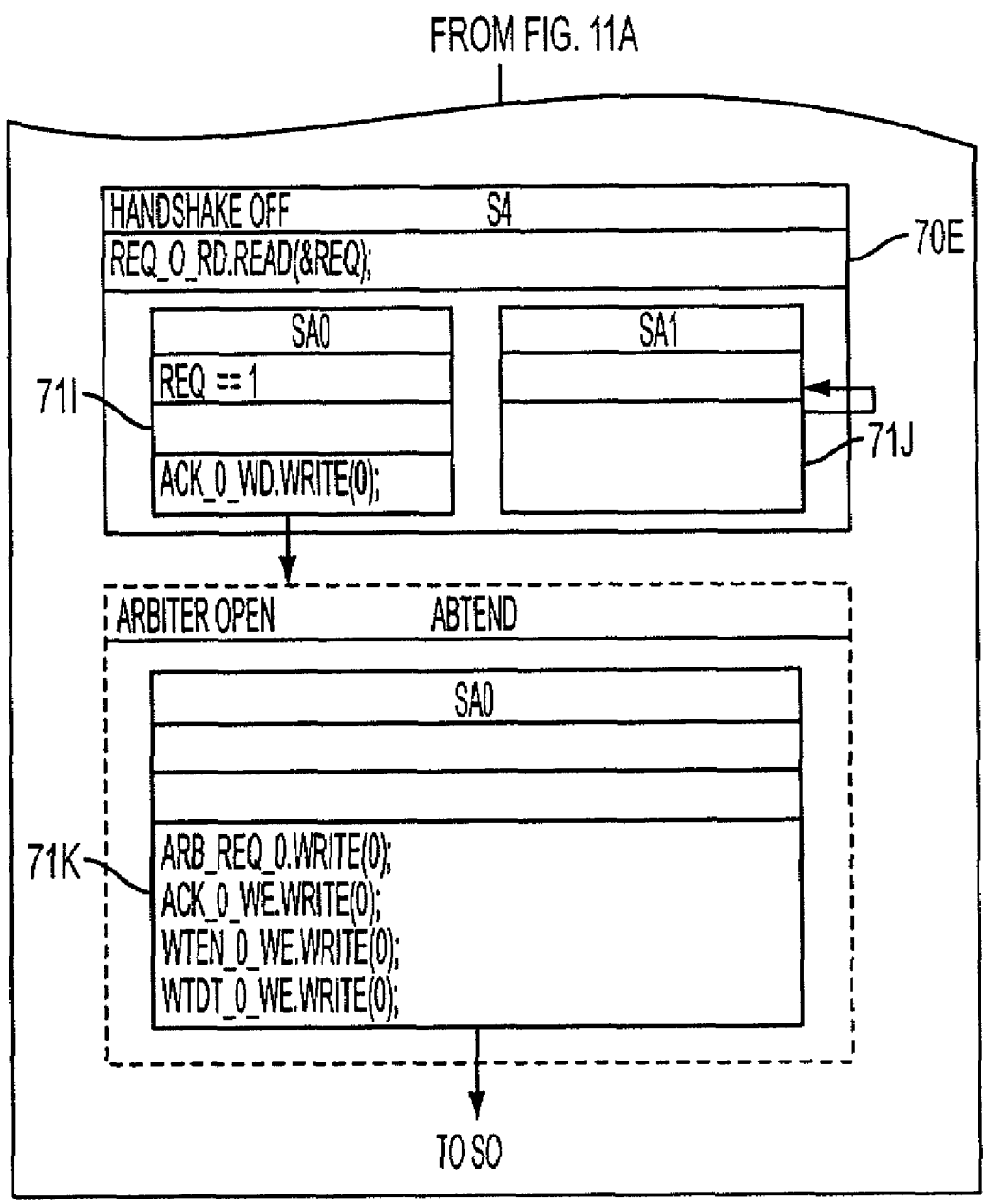

FIGS. 11A-B show specific configurations for command A in FIG. 8. In FIGS. 11A-B, "S0" to "S4" each represent a state corresponding to any of the activated symbols 56A in FIG. 6, and "ABTBEGIN" and "ABTEND" represent the states for acquiring and opening the arbiter, respectively.

In FIGS. 11A-B, frames 70A to 70E, each indicating a state, include the name of the state (the first line); the input message for the state and the name of the channel to which the input message is input (the second line); and the state action representing the processing content in the state (the third line).

Frames 71A to 71K, each indicating a state action, include the name of the state action (the first line); the condition under which the state action is executed (the second line); the processing code for the state action (the third line); and the output value in the state action and the name of the channel that outputs the output value (the fourth line).

Incidentally, the character string "!(CNT!=0x00)" described between the state "S2" and the state "S3" represents a transition condition, and here indicate that the state "S2" shifts to the state "S3" when the counter value becomes "0x00."

Figure 12:
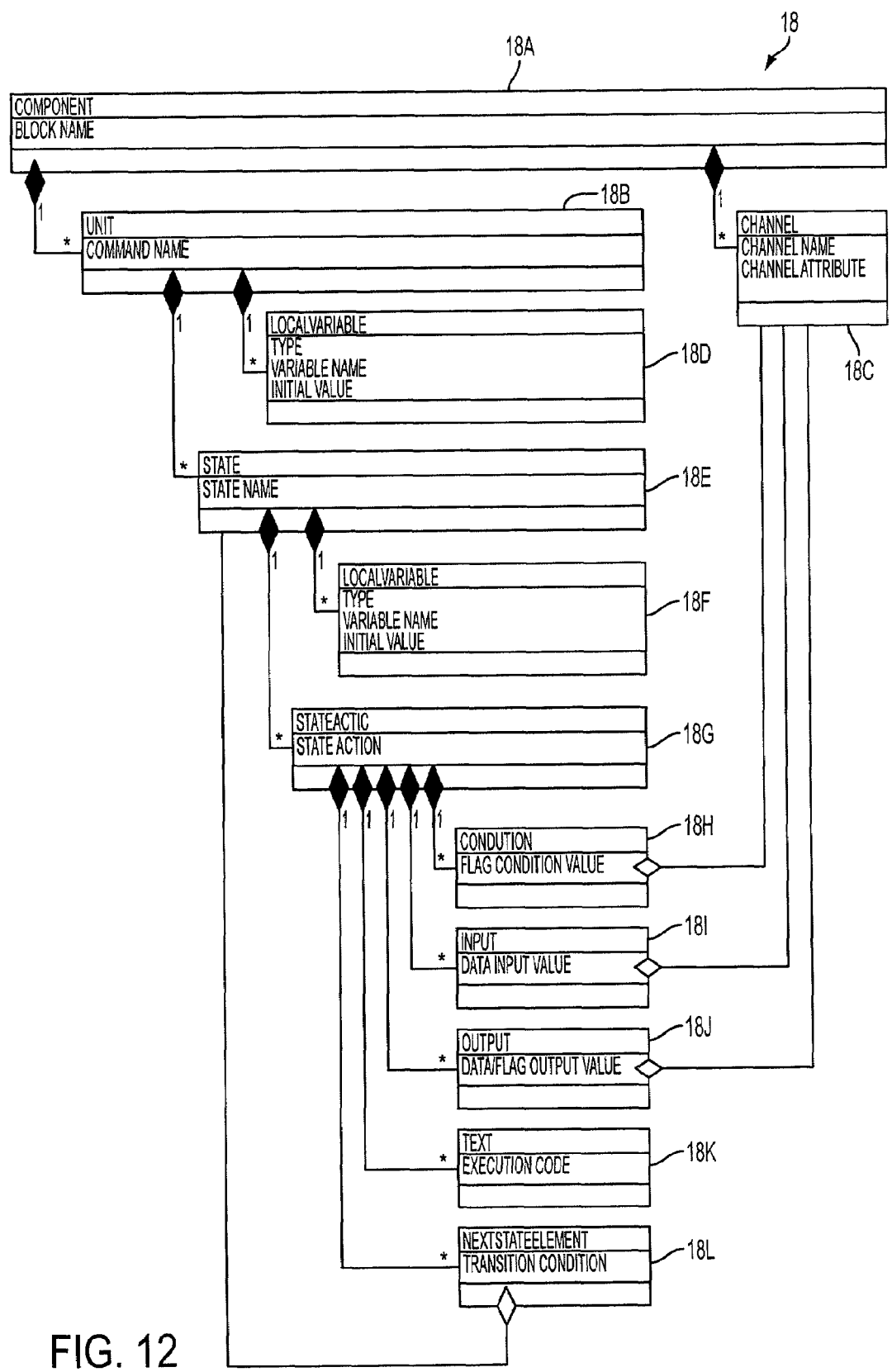
FIG. 12 is a class diagram showing a configuration for a design database.

FIG. 12 shows a specific configuration for the design database 18 created at step SP2 in the design work using the LSI design method according to this embodiment, which has been described with reference to FIG. 5.

As apparent from FIG. 12, the design database 18 includes, as the uppermost layer, a class 18A named "Component", which stores the name of the design-target block 60 (FIG. 8); and includes, as the lower layers, a class 18B named "Unit" which stores the name of the command present in the block or the unit such as the arbiter, reception block or transmission block and a class 18C named "Channel" which stores the name and attribute of the channel present in the block 60.

A class 18D named "Local Variable" exists for each unit as the lower layer of the class 18B "Unit," and stores the type, variable name, and initial value for the relevant unit. Also, a class 18E named "State" exists and corresponds with each command in the unit as the lower layer of the class 18B "Unit", and stores the name of the state defined in the command.

Moreover, a class 18F named "Local Variable" exists and corresponds with the state as the lower layer of the class 18E "State," and stores the type, variable name, and initial value for the state. Also, a class 18G named "State Action" exists as the lower layer of the class 18E "State," and stores the name of the state action defined in the state.

Furthermore, classes 18H to 18L respectively named "Condition," "Input," "Output," "Text," and "NextState Element" exist as the lower layers of the class 18G "State Action," and respectively store the flag condition value, data input value, data/flag output value, execution code, and transition condition for the relevant state action.

The class 18E "State" is linked to the class 18L "NextState Element," and the class 18C "Channel" is linked to the classes 18H "Condition," 18I "Input," and 18J "Output," respectively.

(2-2) Module Configuration for Data Path Share Program

Figure 13:
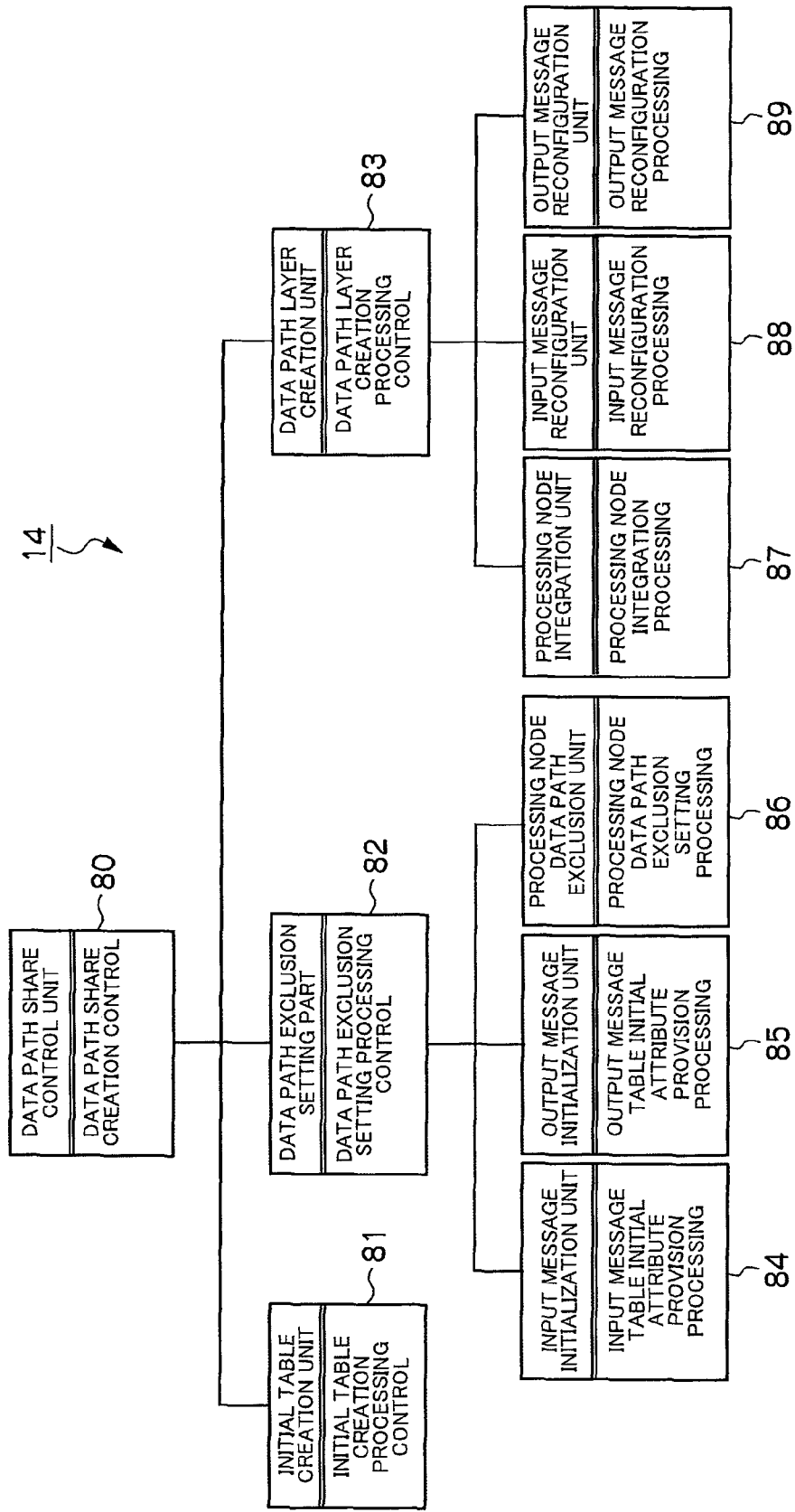
FIG. 13 is a class diagram showing a module configuration for a data path share program.

FIG. 13 shows a module configuration for the data path share program 14 (FIG. 1). In the data path share program 14, with a data path share control unit 80 serving as the highest layer, an initial table creation unit 81, a data path exclusion setting unit 82, and a data path layer creation unit 83 exist as the lower layers. The initial table creation unit 81, the data path exclusion setting unit 82, and the data path layer creation unit 83 are called by the data path share control unit 80 as needed.

Also, an input message initialization unit 84, an output message initialization unit 85, and a processing node data path exclusion unit 86 exist as the lower layers of the data path exclusion setting unit 82. The input message initialization unit 84, the output message initialization unit 85, and the processing node data path exclusion unit 86 are called by the data path exclusion setting unit 82 as needed. Moreover, a processing node integration unit 87, an input message reconfiguration unit 88, and an output message reconfiguration unit 89 exist as the lower layers of the data path layer creation unit 83. The processing node integration unit 87, the input message reconfiguration unit 88, and the output message reconfiguration unit 89 are called by the data path layer creation unit 83 as needed.

The above module functions will be described later.

(2-3) Configuration for Internal Tables

Figure 14:
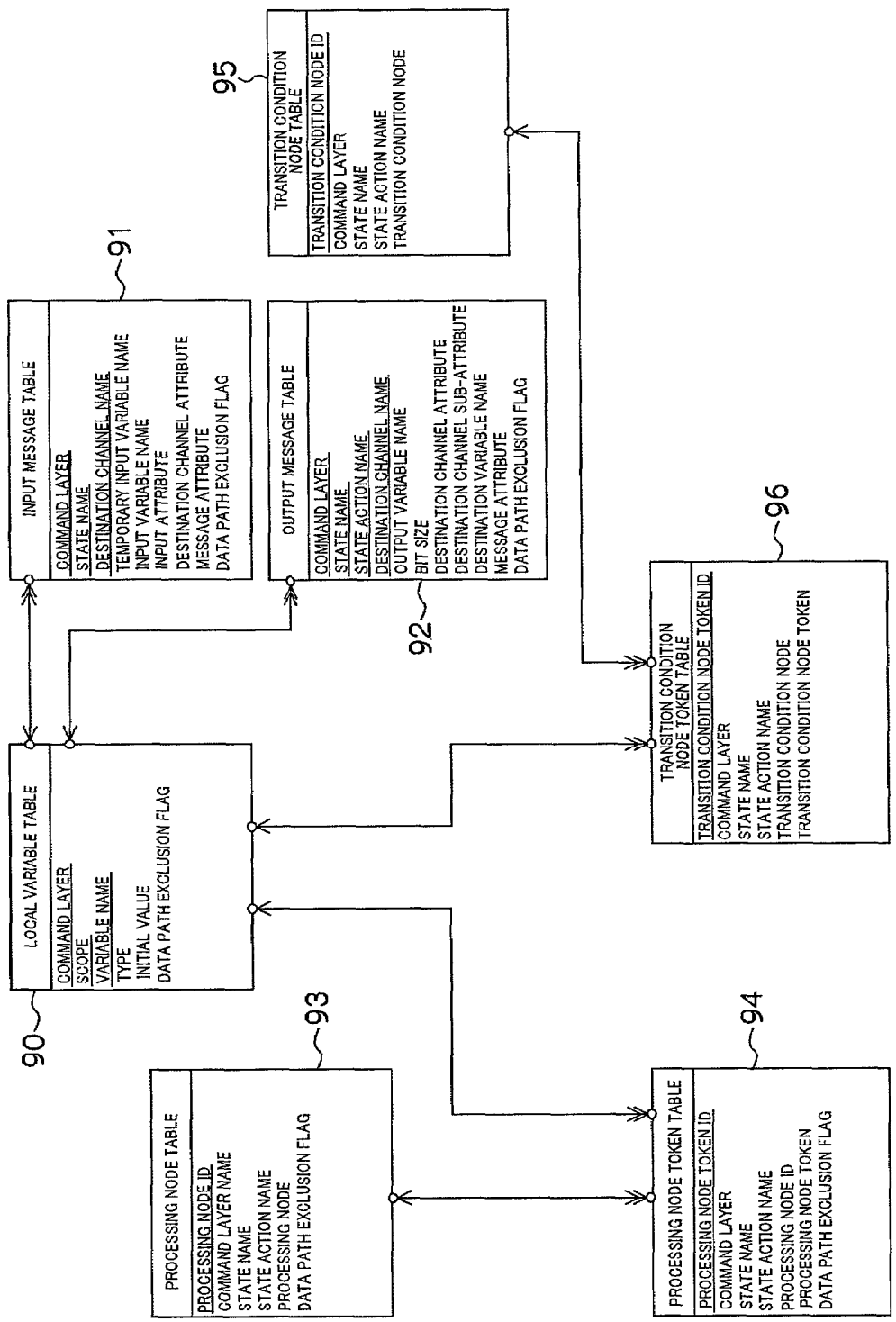
FIG. 14 is a class diagram for the explanation of internal tables.

FIG. 14 shows the connection between internal tables managed by the data path share program 14. As apparent from FIG. 14, in the LSI design apparatus 1 in this embodiment, a local variable table 90, an input message table 91, an output message table 92, a processing node table 93, a processing node token table 94, a transition condition node table 95, and a transition condition node token table 96 are provided as the internal tables. The association between the internal tables will be described with reference to FIGS. 31 to 34.

The local variable table 90 is a table for managing the local variables used in the exclusive group 63 described above with reference to FIG. 8. As shown in FIG. 15, the local variable table 90 is composed of a "command layer" column 90A, a "scope" column 90B, a "variable name" column 90C, a "type" column 90D, an "initial value" column 90E, and a "data path exclusion flag" column 90F.

The "command layer" column 90A stores the name ("command A" or "command B") of the layer of the command for which the relevant local variable is defined, and the "scope" column 90B stores the scope range in which the local variable is effective. For example, "Unit" is stored in the "scope" column 90B when the local variable is effective in the command layer, and the state name is stored in the "scope" column 90B when the local variable is effective only in the state in the command. Also, the "variable name" column 90C stores the name of the local variable.

The "type" column 90D and the "initial value" column 90E store the type and the initial value of the local variable, respectively. The "data path exclusion flag" column 90F stores the data path exclusion flag concerning whether the local variable corresponding to the relevant record is for control system processing or data system processing.

The input message table 91 is a table for managing the input message given to a command layer. As shown in FIG. 16, the input message table 91 is composed of a "command layer" column 91A, a "state name" column 91B, a "destination channel name" column 91C, a "temporary input variable name" column 91D, an "input variable name" column 91E, an "Input attribute" column 91F, a "destination channel attribute" column 91G, a "message attribute" column 91H, and a "data path exclusion flag" column 91I.

The "command layer" column 91A stores the name of the command layer in which an event occurs because of the relevant input message, and the "state name" column 91B stores the name of the state in which an input event occurs because of the input message among the states in the command layer. Also, the "destination channel name" column 91C stores the name of any one of the channels 61A to 61H to which the input message is input.

The "temporary input variable name" column 91D stores the name of the variable with which the input message is temporarily converted, and the "input variable name" column 91E stores the name of the final local variable with which the input message is converted. Note that the "input variable name" column 91E stores "NONE" when the input variable name has not been defined.

The "Input attribute" column 91F stores information on whether the input message is either a data type message or a flag type message. For example, "input" is stored when the input message is a data type message, while "condition" is stored when the input message is a flag type message. Whether the input message is either a data type message or a flag type message is determined clearly by the channel (66A to 66J) the input message goes through. Whether the input message is either a data type message or a flag type message to any one of the channels 66A to 66J is defined in advance.

The "destination channel attribute" column 91G stores the attribute of the channel (66A to 66J) the input message goes through. The attribute of each of the channels 66A to 66J is determined in advance depending on the type of the input message. For example, "arb" is stored when the input message is from the arbiter 65 (FIG. 8); "share" is stored when the input message is of a type in which the message is sorted in the reception block 62 (FIG. 8); and "normal" is stored when the input message is a normal message for which a destination (command) is specified.

The "message attribute" column 91H stores the attribute of the input message. For example, "ctl" is stored when the input message is a control system message; "data" is stored when the input message is a data system message; and "dummy" is stored when the input message is neither a control system message nor a data system message. As described later, the message attribute is determined in accordance with the determination specification shown in FIG. 17.

The "data path exclusion flag" column 91I stores a data path exclusion flag indicating whether the input message corresponding to the relevant record is either for control system processing or data system processing. Note that the default value of the data path exclusion flag in the input message table 91 is "TRUE" indicating that the corresponding input message is a data system message.

The output message table 92 is a table for managing an output message output from each command. As shown in FIG. 18, the output message table 92 is composed of a "command layer" column 92A, a "state name" column 92B, a "state action name" column 92C, a "destination channel name" column 92D, an "output variable name" column 92E, a "bit size" column 92F, a "destination channel attribute" column 92G, a "destination channel sub-attribute" column 92H, a "destination variable name" column 92I, a "message attribute" column 92J, and a "data path exclusion flag" column 92K.

The "command layer" column 92A stores the name of the command layer from which the relevant output message is output, and the "state name" column 92B stores the name of the state in which an output event occurs in the command. The "state action name" column 92C stores the name of the state action in which the output event occurs among the state actions (sub-states) in the state, and the "destination channel name" column 92D stores the name of the channel (67A to 67L) (FIG. 8) through which the output message is output.

The "output variable name" column 92E store the name of the output local variable, and the "bit size" column 92F stores the bit size of the local variable. Also, the "destination channel attribute" column 92G stores the attribute of the channel (67A to 67L) through which the output message is output. The attribute depends on the type of the output message. For example, "arb" is stored when the output message is from the arbiter 65 (FIG. 8); "share" is stored when the output message is of a type in which the message is sorted in the transmission block 64; and "normal" is stored when the output message is a normal message.

The "destination channel sub-attribute" column 92H stores the sub-attribute of the channel (67A to 67L) through which the output message is output. For example, for the case where the corresponding channel has "share" as its channel attribute, "data" is stored when the output message is a message for the value selected in the transmission block 64 (FIG. 8), and "en" is stored when the output message is a flag message that instructs the transmission block 64 to make a selection. Note that "arb" is stored when the channel attribute of the corresponding one of the channels 67A to 67L is "arb"; and "data" is stored when the channel attribute is "normal."

Moreover, the "destination variable name" column 92I stores the name of a variable for which a value is substituted in a destination command, and the "message attribute" column 92J stores the attribute of the output message. For example, "ctl" is stored when the output message is a control system message, and "data" is stored when the output message is a data system message. As described later, the message attribute is determined in accordance with the specification shown in FIG. 19.

Moreover, the "data path exclusion flag" column 92K stores a data path exclusion flag indicating whether the output message is either for control system processing or data system processing. Specifically, "TRUE" is stored when the attribute of any of the destination channels 67A to 67L is "ctl," and "FALSE" is stored when the attribute is "data." Note that the default value of the data path exclusion flag in the output message table 92 is "TRUE."

The processing node table 93 is a table for managing a processing node executed in a command in accordance with an input message. As shown in FIG. 20, the processing node table 93 is composed of a "command layer" column 93A, a "state name" column 93B, a "state action name" column 93C, a "processing node ID" column 93D, a "processing node" column 93E, and a "data path exclusion flag" column 93F.

The "processing node" column 93E stores the corresponding processing node, and the "command layer" column 93A stores the name of the command layer in which the processing node is executed. The "state name" column 93B stores the name of the state, in which the processing node is executed, in the command layer, and the "state action name" column 93C stores the name of the state action, in which the processing node is executed, in the state.

The "processing node ID" column 93D stores the ID assigned to the processing node, and the "data path exclusion flag" column 93F stores the data path exclusion flag indicating whether the processing node is either a control system or a data system. Note that the default value of the data path exclusion flag in the processing node table 93 is "TRUE."

Moreover, the processing node token table 94 is a table for managing a processing node token obtained by subjecting a processing node to lexical division. As shown in FIG. 21, the processing node token table 94 is composed of a "command layer" column 94A, a "state name" column 94B, a "state action name" column 94C, a "processing node ID" column 94D, a "processing node token ID" column 94E, a "processing node token" column 94F, and a "data path exclusion flag" column 94G.

Of the above columns, the "processing node token ID" column 94E stores the ID assigned to the corresponding processing node token, and the "processing node token" column 94F stores the corresponding processing node token.

The "command layer" column 94A, the "state name" column 94B, the "state action name" column 94C, the "processing node ID" column 94D, and the "data path exclusion flag" column 94G store the same information as that stored in the "command layer" column 93A, the "state name" column 93B, the "state action name" column 93C, the "processing node ID" column 93D, and the "data path exclusion flag" column 93F, respectively, in the processing node table 93 (FIG. 20).

The transition condition node table 95 is a table for managing a transition condition node that is a conditional statement for state transition. As shown in FIG. 22, the transition condition node table 95 is composed of a "command layer" column 95A, a "state name" column 95B, a "state action name" column 95C, a "transition condition node ID" column 95D, and a "transition condition node" column 95E.

The "transition condition node" column 95E stores the corresponding transition condition node, and the "command layer" column 95A stores the name of the command layer in which the transition condition node is executed. The "state name" column 95B stores the name of the state, in which the transition condition node is executed, in the command layer, and the "state action name" column 95C stores the name of the state action, in which the transition condition node is executed, in the state. The "transition condition node ID" column 95D stores the ID assigned to the transition condition node.

Furthermore, the transition condition node token table 96 is a table for managing a transition condition node token obtained by subjecting a transition condition node to lexical division. As shown in FIG. 23, the transition condition node token table 96 is composed of a "command layer" column 96A, a "state name" column 96B, a "state action name" column 96C, a "transition condition node ID" column 96D, a "transition condition node token ID" column 96E, and a "transition condition node token" column 96F.

The "transition condition node token" column 96F stores a transition condition node token, and the "transition condition node token ID" column 96E stores the ID assigned to the transition condition node token.

Also, the "command layer" column 96A, the "state name" column 96B, the "state action name" column 96C, and the "transition condition node ID" column 96D store the same information as that stored in the "command layer" column 95A, the "state name" column 95B, the "state action name" column 95C, and the "transition condition node ID" column 95D, respectively, in the transition condition node table 95.

(2-4) Data Path Share Processing (2-4-1) Flow of Data Path Share Processing

Figure 24:
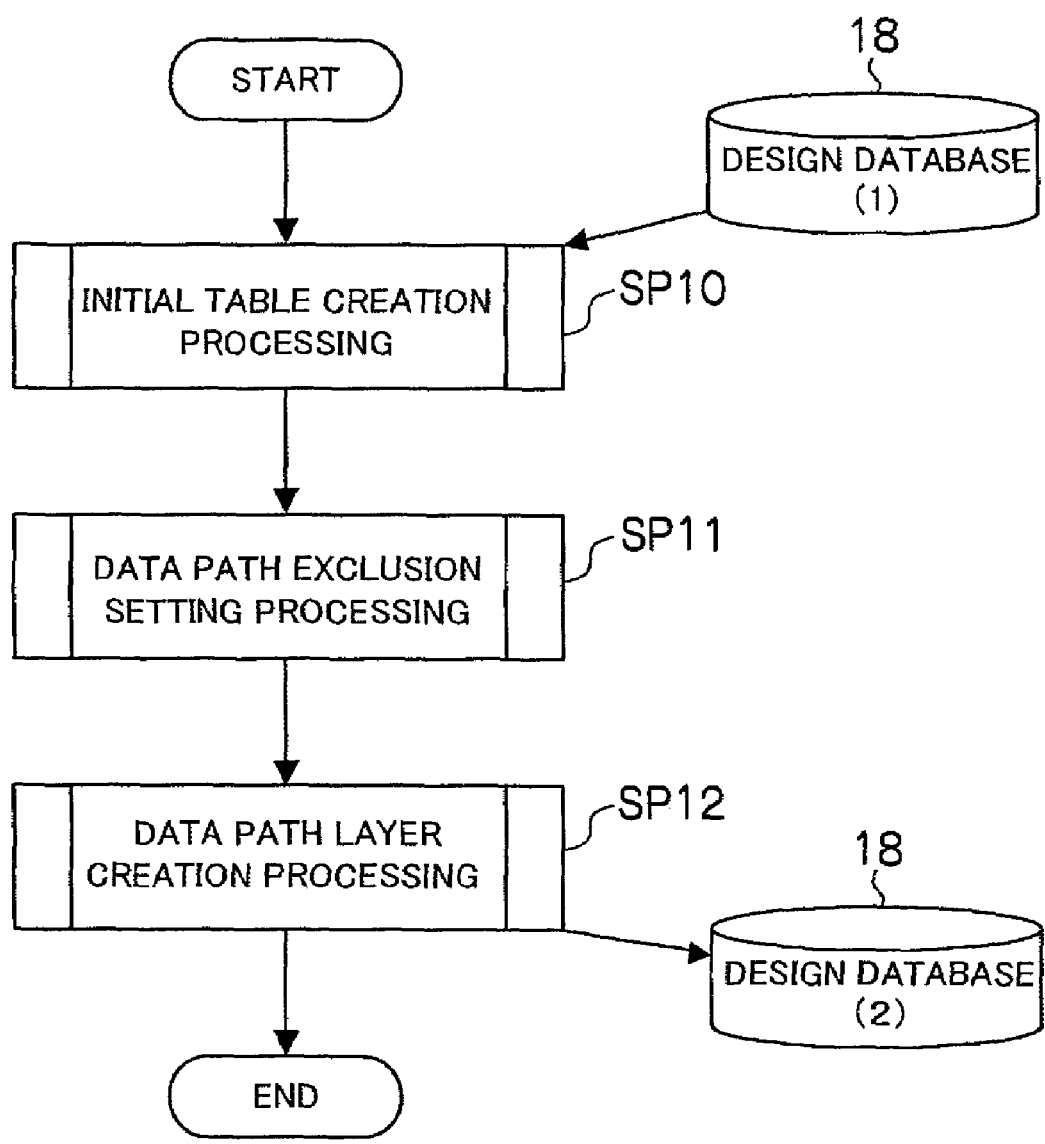
FIG. 24 is a flowchart for the explanation of data path share processing.

FIG. 24 shows the specific content of the processing executed by the CPU (FIG. 1) in the LSI design apparatus 1 concerning the data path share processing (SP3) executed as preprocessing of high-level synthesis in the design work using the LSI design method according to this embodiment described with reference to FIG. 5.

When the CPU 11 proceeds to step SP3 in FIG. 5, it starts the data path share processing, and first calls the initial table creation unit 81 (FIG. 13) in accordance with the data path share control unit 80 (FIG. 13). The CPU 11 then collects necessary information from the design database 18 and develops the collected information in internal tables, thereby creating the internal tables in initial states in accordance with the initial table creation unit 81 (SP10).

Subsequently, the CPU 11 calls the data path exclusion setting unit 82 (FIG. 13) in accordance with the data path share control unit 80, and sets the data path exclusion flags for the respective internal tables in accordance with the data path exclusion setting unit 82 and its lower layers, i.e., the input message initialization unit 84 (FIG. 13), the output message initialization unit 85 (FIG. 13), and the processing node data path exclusion unit 86 (FIG. 13) (SP11).

The CPU 11 then calls the data path layer creation unit 83 (FIG. 13) in accordance with the data path share control unit 80; creates the data path layer 41 (FIG. 4) in the design-target block 60 described with reference to FIG. 8 in accordance with the data path layer creation unit 83 and its lower layers, i.e., the processing node integration unit 87 (FIG. 13), the input message reconfiguration unit 88 (FIG. 13), and the output message reconfiguration unit 89; and migrates the processing code and message in each command 34 (FIG. 4) to the data path layers 41 while referring to the data path exclusion flag for each internal table set at step SP11 (SP12).

(2-4-2) Initial Table Creation Processing

Figure 25:
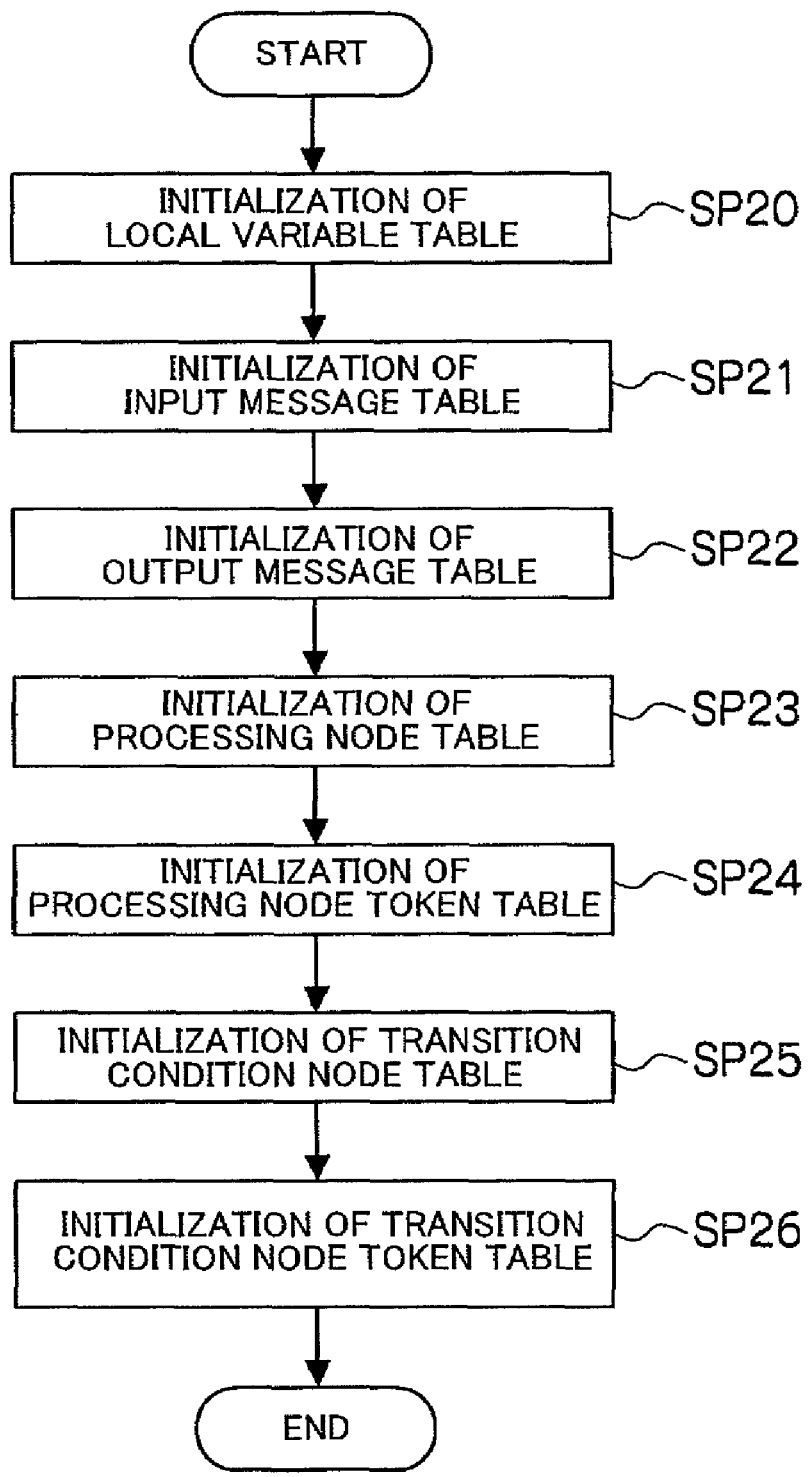
FIG. 25 is a flowchart for the explanation of initial table creation processing.

When the CPU 11 proceeds to step SP10 in the data path share processing described above with reference to FIG. 24, it starts the initial table creation processing shown in FIG. 25, and first initializes the local variable table 90 (FIG. 15) (SP20). Specifically, the CPU 11 collects definition information on the local variables set for the command layers from the design database 18, and develops the collected information in the local variable table 90. At this point, the CPU 11 sets the data path exclusion flags for the records in the local variable table 90 to "TRUE" without exception.

Subsequently, the CPU 11 initializes the input message table 91 (FIG. 16) (SP21). Specifically, the CPU 11 collects the information on the input message for each command layer from the design database 18, and develops the collected information in the input message table 91. Also, the CPU 11 acquires the channel attribute information about the channels 66A to 66J (FIG. 8) for input messages which are respectively connected to the command layers from the design database 18, and stores the acquired information in the input message table 91. Incidentally, at the initial stage, the CPU 11 sets the message attribute for each input message to "NULL," and sets the data path exclusion flags to "TRUE" without exception in the input message table 91.

The CPU 11 then initializes the output message table 92 (FIG. 18) (SP22). Specifically, the CPU 11 collects the information about the output message from each of the command layers from the design database 18, and develops the collected information in the output message table 92. Also, the CPU 11 acquires the channel attribute information about the channels 67A to 67L for output messages which are respectively connected to the command layers from the design database 18, and stores the acquired information in the output message table 92. Incidentally, at the initial stage, the CPU 11 sets the message attribute for each output message to "NULL," and sets all the data path exclusion flags to "TRUE" without exception in the output message table 92.

After that, the CPU 11 initializes the processing node table 93 (FIG. 20) (SP23). Specifically, the CPU 11 acquires the information on the processing codes included in the state actions in the command layers from the design database 18. The processing codes include assignment statements, calculation assignment statements, function calls, etc., but do not include selection statements, repetition statements, jump statements, etc. Each of the processing codes is divided on a syntax basis, and the result is stored in the processing node table 93 as processing nodes. For example, the processing node shown in FIG. 26A is divided into the processing node "WTDT=DIN0+DIN1;" and the processing node "CNT−;" and the processing nodes are stored in the processing node table 93. Note that the CPU 11 sets the data path exclusion flags in the records in the processing node table 93 to "TRUE" without exception.

The CPU 11 then initializes the processing node token table 94 (FIG. 21) (SP24). Specifically, the CPU 11 reads the processing node for each record from the processing node table 93, and subjects the read processing node to lexical division. The CPU 11 stores only a variable part and an invariable part as processing node tokens from among the divided lexical tokens (intermediate tokens) in the processing node token table 94. Therefore, as shown in, e.g., FIG. 27, in the case of the processing node "WTDT=DIN0+DIN1;" (FIG. 27A), the processing node is divided into the tokens "WTDT," "=," "DIN0," "+," "DIN1," and ";" (FIG. 27B), and only the tokens "WTDT," "DIN0," and "DIN1," among the above tokens are stored in the processing node token table 94 as the processing node tokens (FIG. 27C). Also, the CPU 11 sets the data path exclusion flags for the records in the processing node token table 94 to "TRUE" without exception.

Next, the CPU 11 initializes the transition condition node table 95 (FIG. 22) (SP25). Specifically, the CPU 11 acquires the transition condition nodes included in the state actions in each command from the design database 18, and develops the acquired nodes in the transition condition node table 95.

The CPU 11 then initializes the transition condition node token table 96 (FIG. 23) (SP26). Specifically, the CPU 11 reads a transition condition node for each record from the transition condition node table 95, and subjects the read transition condition node to lexical division. The CPU 11 develops only a variable part, which serves as a transition condition node token, from among the divided lexical tokens (intermediate tokens) in the transition condition node token table 96. Therefore, as shown in, e.g., FIG. 28, in the case of the transition condition node "CNT!=0x00"(FIG. 28A), the transition condition node is divided into the tokens "CNT," "!=," and "0x00,"(FIG. 28B), and only the token "CNT" from among the tokens is stored as the transition condition node token in the transition condition node token table 96 (FIG. 28C).

(2-4-3) Data Path Exclusion Setting Processing

When the CPU 11 proceeds to step SP11 in the data path share processing described above with reference to FIG. 24, it starts the data path exclusion setting processing shown in FIG. 29, and first sets the message attribute and data path exclusion flag for each record in the input message table 91 in accordance with the input message initialization unit 84 (FIG. 13) (SP30).

Specifically, the CPU 11 retrieves an input message for each record from the input message table 91, and sets a message attribute for each record, for which the input message was retrieved, in accordance with the message attribute determination specification shown in FIG. 17, thereby creating a hash table in which the destination channels 66A to 66J (FIG. 8) serve as keys; and the message attributes serve as values.

Incidentally, one channel may be used for both control system processing and data system processing. In this case, such channels are collected in the hash table, and "ctl" indicating that the relevant input message control system one, "data" indicating that the input message is a data system one, and "dummy" indicating that the input message is neither a control system one nor a data system one, which are put in priority order, are set as the values for the message attributes.

The CPU 11 sets the message attribute for each record in the input message table 91 in accordance with the created hash table. Also, the CPU 11 sets the data path exclusion flag to "FALSE" for the record with the message attribute "ctl," and sets the data path exclusion flag to "TRUE" for the record with the message attribute "data."

Subsequently, the CPU 11 sets the message attribute and data path exclusion flag for each record in the output message table 92 (FIG. 18) in accordance with the output message initialization unit 85 (FIG. 13) (SP31).

Specifically, the CPU 11 retrieves an output message for each record from the output message table 92, and sets a message attribute for each record, for which the output message was retrieved, in accordance with the message attribute determination specification shown in FIG. 19, thereby creating a hash table in which the destination channels 67A to 67L (FIG. 8) serve as keys; and the message attributes serve as values.

Incidentally, one channel may be used for both control system processing and data system processing. In this case, such channels are collected in the hash table, and "ctl" indicating that the relevant output message is a control system one and "data" indicating that the output message is a data system one, which are put in priority order, are set as the values for the message attributes.

The CPU 11 sets the message attribute for each record in the output message table 92 in accordance with the created hash table. Also, the CPU 11 sets the data path exclusion flag to "FALSE" for the record with the message attribute "ctl," and sets the data path exclusion flag to "TRUE" for the record with the message attribute "data."

Figure 30:
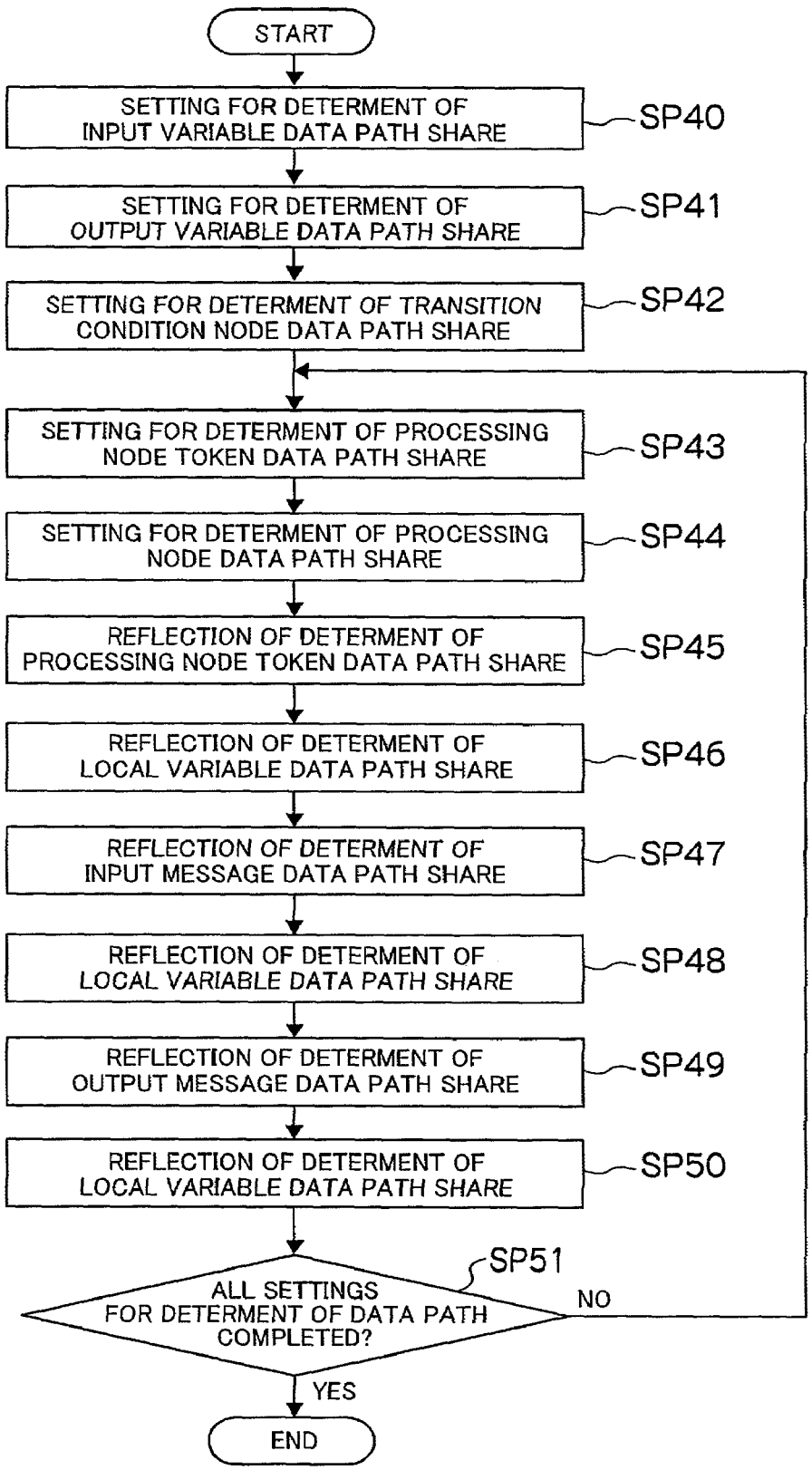
FIG. 30 is a flowchart for the explanation of processing node data path exclusion setting processing.

Next, according to the procedure for the processing node data path exclusion setting processing shown in FIG. 30, the CPU 11 sets the data path exclusion flags in the records corresponding to the control system processing nodes among the records in each of the local variable table 90, the input message table 91, the output message table 92, the processing node table 93, and the processing node token table 94 to "FALSE" in accordance with the processing node data path exclusion unit 86 (SP32).

More specifically, first, as shown in FIG. 31A, the CPU 11 updates the data path exclusion flag in the record in the local variable table 90, which corresponds to the record including the data path exclusion flag set to "FALSE" and at least either one of the corresponding input variable name and the corresponding temporary input variable name in the input message table 91, to "FALSE"(SP40).

Then, as shown in FIG. 31B, the CPU 11 updates the data path exclusion flag in the record in the local variable table 90, which corresponds to the record including the data path exclusion flag set to "FALSE" and the corresponding output variable name in the output message table 92, to "FALSE" (SP41).

Subsequently, as shown in FIG. 31C, the CPU 11 refers to the transition condition node token table 96, and updates the data path exclusion flag in the record in the local variable table 90, which corresponds to the record including the corresponding transition condition node token registered in the transition condition node token table 96, to "FALSE"(SP42).

As shown in FIG. 32A, the CPU 11 then refers to the local variable table 90, and updates the data path exclusion flag in the record in the processing node token table 94, which corresponds to the record including the data path exclusion flag set to "FALSE" and the corresponding local variable, to "FALSE"(SP43).

As shown in FIG. 32B, the CPU 11 refers to the processing node token table 94, and updates the data path exclusion flag in the record in the processing node table 93, which corresponds to the record including the data path exclusion flag set to "FALSE" and the same registered processing ID as that in the record, to "FALSE"(SP44).

Then, as shown in FIG. 32C, the CPU 11 refers to the processing node table 93, and updates the data path exclusion flag in the record in the processing node token table 94, which corresponds to the record including the data path exclusion flag set to "FALSE" and the same registered processing node ID as that in the record, to "FALSE"(SP45).

Next, as shown in FIG. 33A, the CPU 11 refers to the processing node token table 94, and updates the data path exclusion flag in the record in the local variable table 90, which corresponds to the record including the data path exclusion flag set to "FALSE" and the corresponding processing node token, to "FALSE"(SP46).

As shown in FIG. 33B, the CPU 11 then refers to the local variable table 90, and updates the data path exclusion flag in the record in the input message table 91, which corresponds to the record including the data path exclusion flag set to "FALSE" and the same registered variable name as the input variable name or temporary input variable name in the record, to "FALSE." Also, the CPU 11 retrieves the record in the input message table 91, which includes the same channel name in the "destination channel name" column 91C as that in the record including the updated data path exclusion flag "FALSE" in the input message table 91. If the retrieval-target record exists, the CPU 11 sets the data path exclusion flag in the record to "FALSE"(SP47).

Then, as shown in FIG. 33C, the CPU 11 refers to the input message table 91, and updates the data path exclusion flag in the record in the local variable table 90, which corresponds to the record including the data path exclusion flag set to "FALSE" and at least one of the same input variable name and the same temporary input variable name as the variable name in the record, to "FALSE"(SP48).

Subsequently, as shown in FIG. 34A, the CPU 11 refers to the local variable table 90, and updates the data path exclusion flag in the record in the output message table 92, which corresponds to the record including the data path exclusion flag set to "FALSE" and the same registered variable name as the output variable name in the record, to "FALSE." Also, the CPU 11 retrieves the record in the output message table 92, which includes the same channel name in the "destination channel name" column 92D as that in the record including the updated data path exclusion flag "FALSE" in the output message table 92. If the retrieval-target record exists, the CPU 11 sets the data path exclusion flag in the record to "FALSE" (SP49).

As shown in FIG. 34B, the CPU 11 then refers to the output message table 92, and updates the data path exclusion flag in the record in the local variable table 90, which corresponds to the record including the data path exclusion flag set to "FALSE" and the same output variable name as the variable name in the record, to "FALSE"(SP50).

After that, the CPU 11 judges whether or not the entire data path determent setting has been completed (SP51). Specifically, the CPU 11 judges, at step SP51, whether or not any of the data exclusion flags for any of the records in any of the internal tables has been set to "FALSE" in step SP43 through SP50. If the CPU 11 obtains a negative result, it returns to step SP43, and repeats the same processing until it obtains a positive result at step SP51 (SP43 to SP51-SP43).

When the CPU 11 finally obtains a positive result at step SP51, it terminates the processing node path exclusion setting processing.

Figure 35:
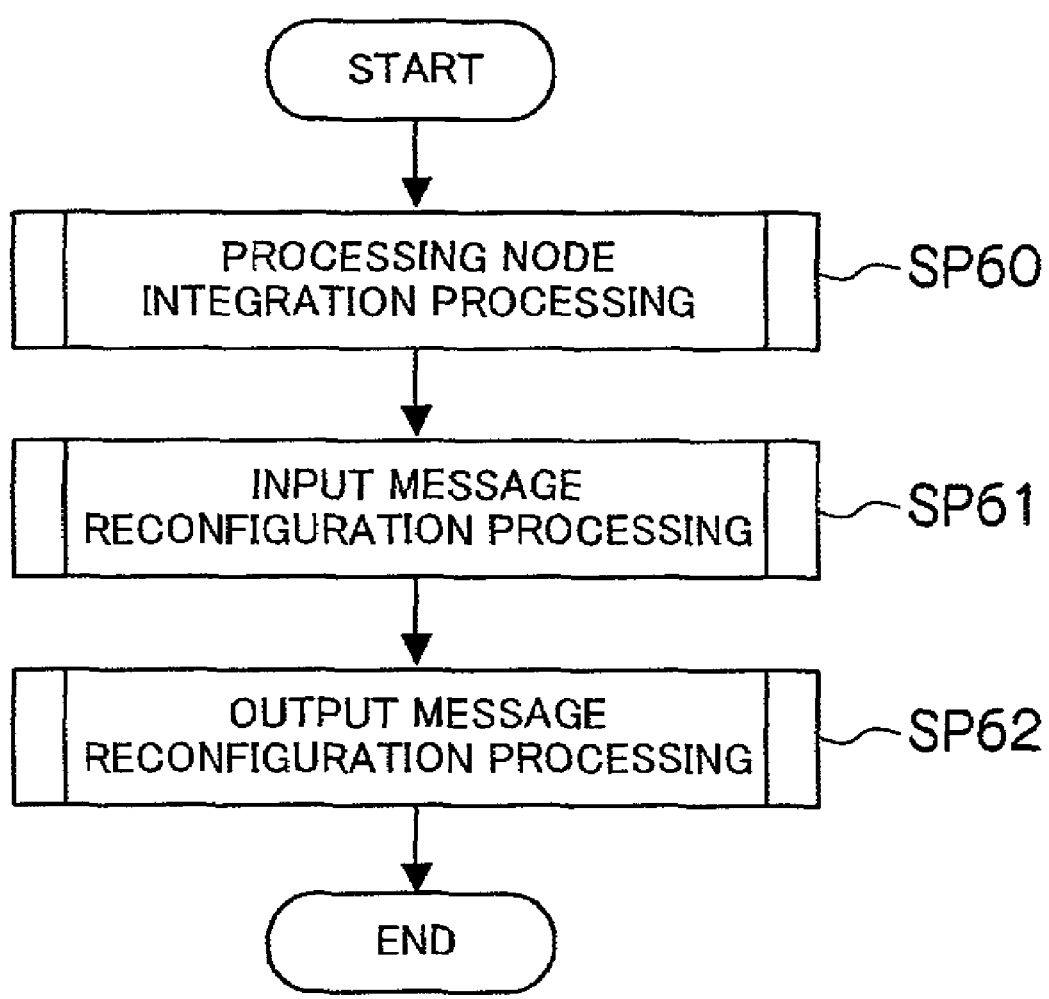
FIG. 35 is a flowchart for the explanation of data path layer creation processing.

(2-4-4) Data Path Layer Creation Processing When the CPU 11 proceeds to step SP12 in the data path share processing described above with reference to FIG. 24, it calls the data path layer creation unit 83 (FIG. 13), and executes the data path layer creation processing shown in FIG. 35 in accordance with the data path layer creation unit 83 and its lower layers, i.e., the processing node integration unit 87 (FIG. 13), the input message reconfiguration unit 88 (FIG. 13), and the output message reconfiguration unit 89 (FIG. 13).

More specifically, when the CPU 11 proceeds to step SP12 in the data path share processing in FIG. 24, it calls the processing node integration unit 87, creates the data path layer (refer to reference numeral 41 in FIG. 4) for storing data system processing for each command layer on the design database 18, and migrates the data system behavior separated from the command layer to the data path layer in accordance with the processing node integration unit 87 (SP60).

The CPU 11 calls the input message reconfiguration unit 88, and the message for which the data path exclusion flag is "TRUE" in the input message table 91 is input to the data path layer in accordance with the input message reconfiguration unit 88 (SP61).

The CPU 11 then calls the output message reconfiguration unit 89, and the message for which the data path exclusion flag is "TRUE" in the output message table 92 is input to the data path layer in accordance with the output message reconfiguration unit 89 (SP62).

Figure 36:
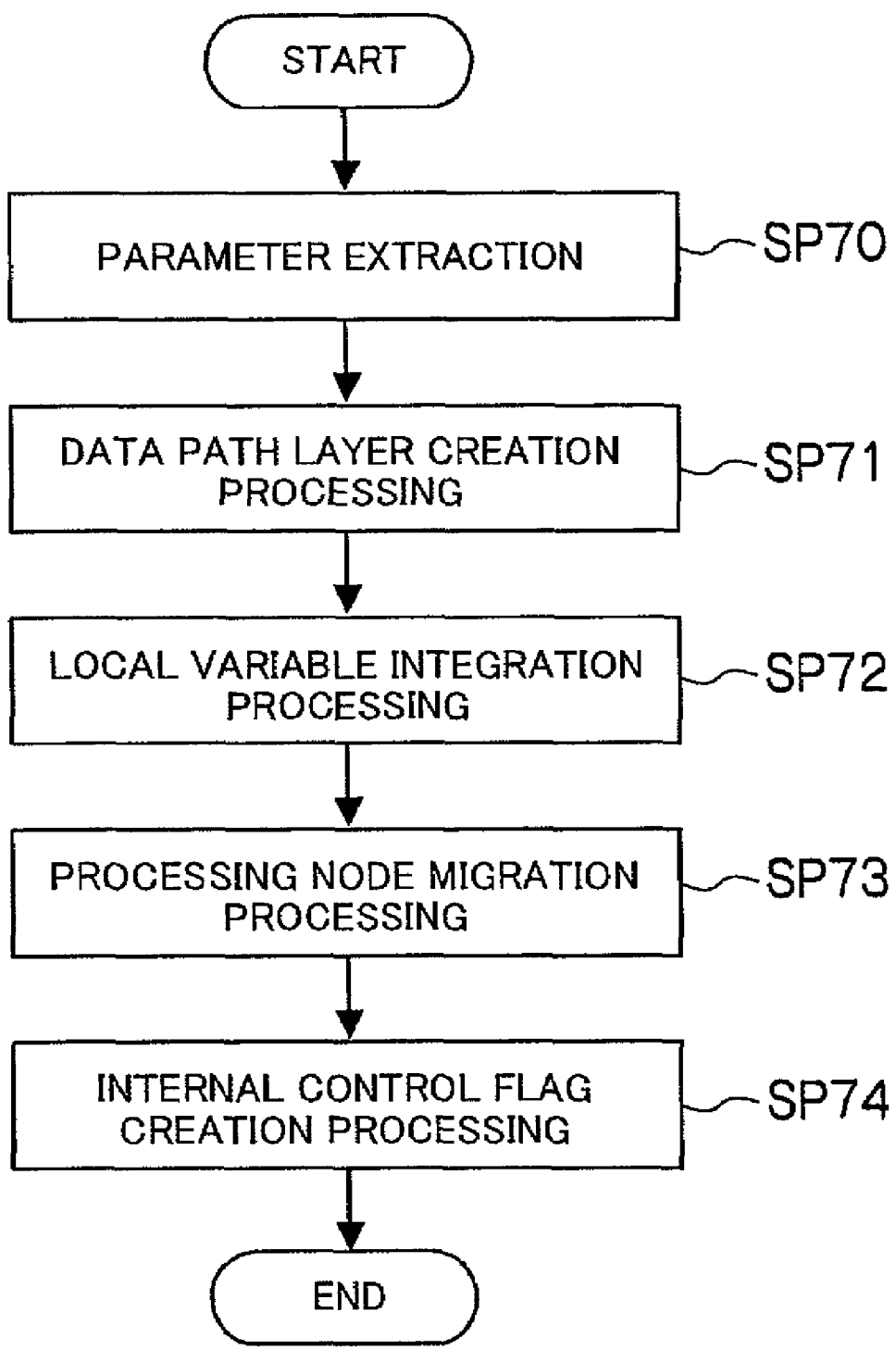
FIG. 36 is a flowchart for the explanation of processing node integration processing.

FIG. 36 is a flowchart showing the specific content of the processing executed by the CPU 11 at step SP60 in FIG. 35.

When the CPU 11 proceeds to step SP12 in the data path share processing in FIG. 24, it starts the processing node integration processing shown in FIG. 36, refers to the processing node table 93 (FIG. 20), and extracts the processing node information of the record with the data path exclusion flag set to "TRUE" in the processing node table 93 (SP70). Specifically, the CPU 11 extracts the command layer, state name, and state action name in the corresponding record as the processing node information.

Also, the CPU 11 refers to the output message table 92 (FIG. 18), and extracts the output message information of the record with the data path exclusion flag set to "TRUE" in the output message table 92 (SP70).

Specifically, the CPU 11 extracts the command layer, state name, and state action name of the corresponding record as the output message information.

Figure 37:
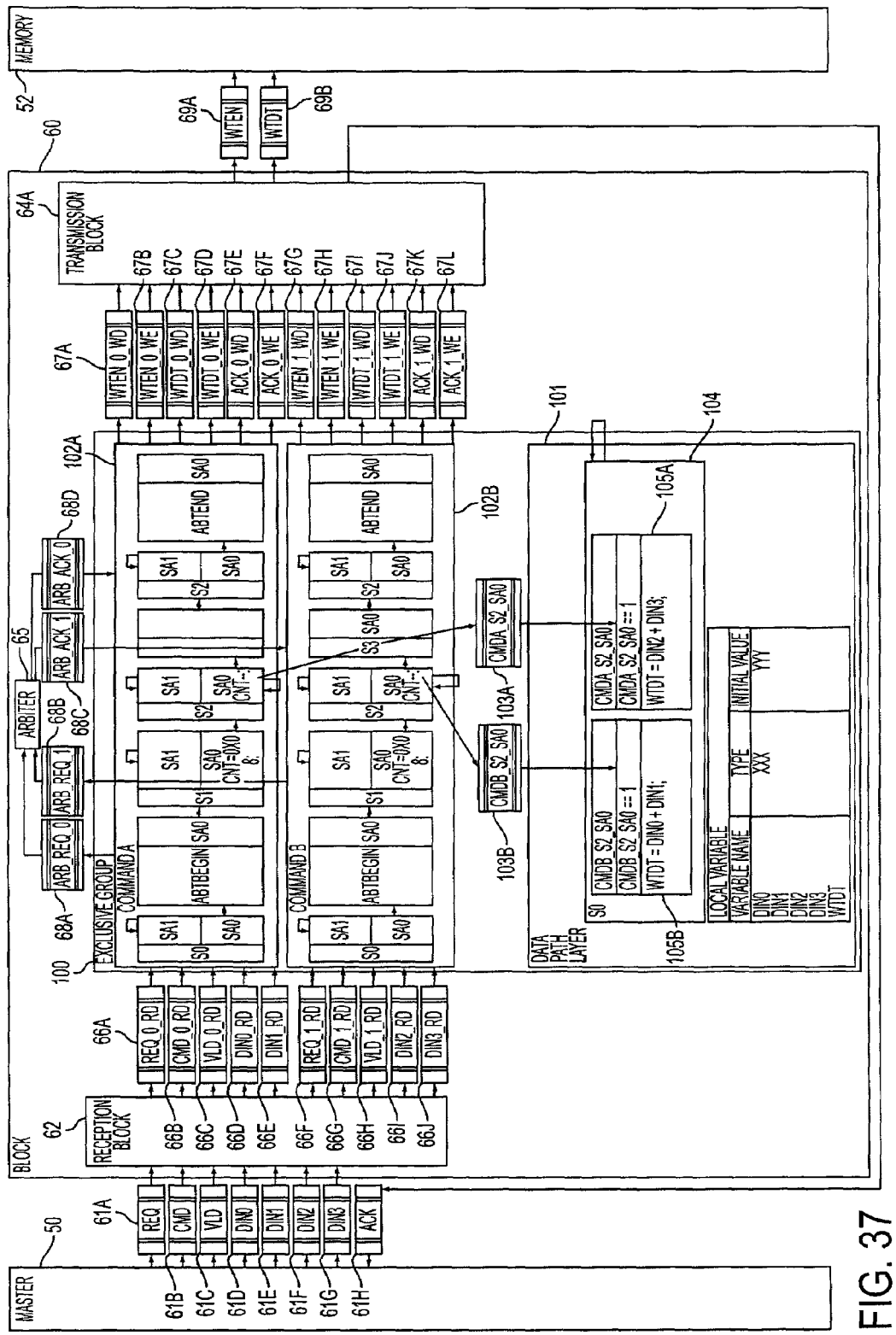
FIG. 37 is a conceptual diagram for the explanation of processing node integration processing.

Subsequently, as shown in FIG. 37, the CPU 11 creates a new data path layer 101 in an exclusive group 100 in the design database 18, and creates channels (hereinafter referred to as "internal control flag channels") 103A and 103B for transmitting internal control flags to the data path layer 101 from command layers 102A and 102B respectively in the exclusive group 100 in accordance with the processing node information extracted from the processing node table 93 and the output message information extracted from the output message table 92 at step SP70. The CPU 11 also creates a state 104 in the data path layer 101, and creates state actions 105A and 105B corresponding to the internal control flags in the state (SP71).

The CPU 11 then extracts the variable name, type and initial value in the record including the data exclusion flag set to "TRUE" from the local variable table 90 (FIG. 15) as local variable information, and defines the corresponding local variable in the data path layer 101. At this point, the CPU 11 integrates the local variables overlapped between the command layers 102A and 102B to be a common local variable. Here, taking the scope of the local variable into consideration, the CPU 11 defines the local variable in the data path layer 101 when the scope is "Unit," and defines the local variable in the corresponding state 104 created in the data path layer 101 (SP72).

The CPU 11 migrates the processing nodes for which the data path exclusion flags have been set to "TRUE" from the processing node table 93 to the corresponding state actions 105A and 105B in the data path layer 101. The CPU 11 also deletes the processing nodes in the design database 18 from the corresponding command layer, state, and state action regarding the created processing nodes.

After that, the CPU 11 makes the connection between the command layers 102A and 102B and the data path layer 101 via the corresponding internal control flag channels 103A and 103B. Note that the internal control flags for the state actions 105A and 105B that have executed the processing migrated from the command layers 102A and 102B to the data path layer 101 as described above are set to "1," and the flags other than the above flags are set to "0."

Figure 38:
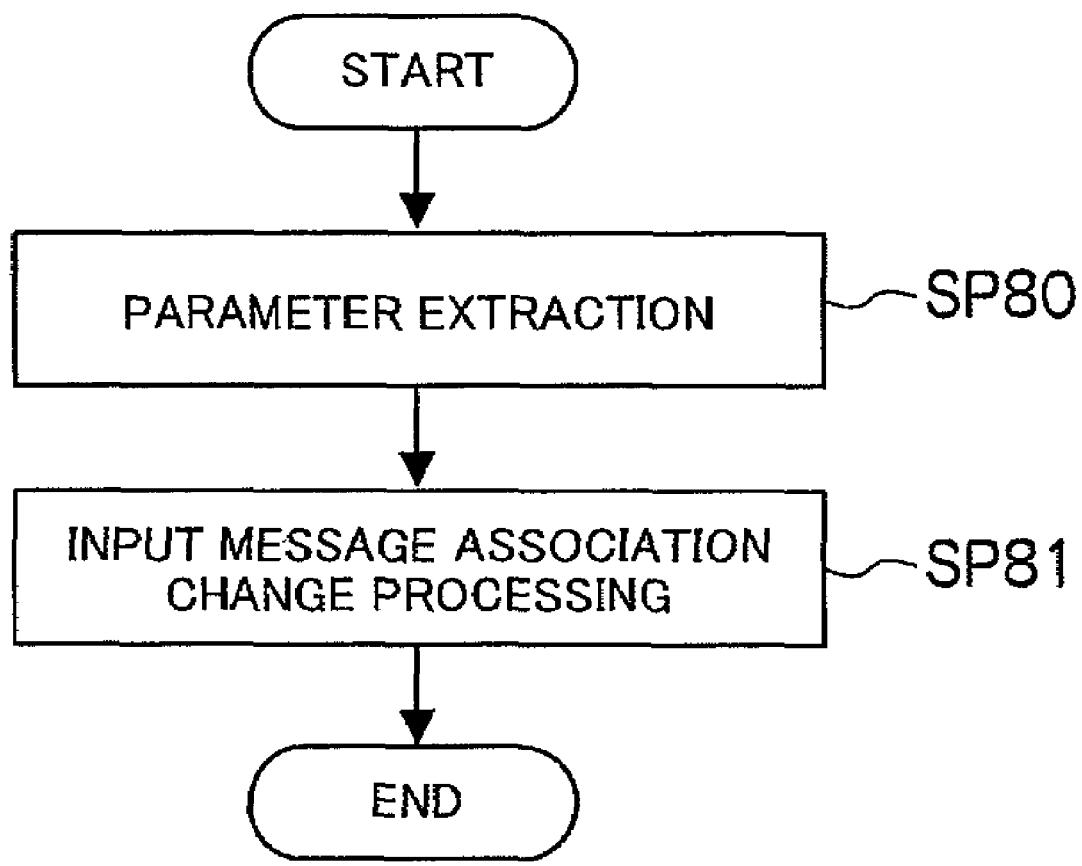
FIG. 38 is a flowchart for the explanation of input message reconfiguration processing.

FIG. 38 is a flowchart showing the specific content of the processing executed y the CPU 11 at step SP61 in FIG. 35.

When the CPU 11 proceeds to step SP61 in the data path layer creation processing, it starts the input message reconfiguration processing shown in FIG. 38. The CPU 11 first refers to the input message table 91 (FIG. 16), and extracts the record (input message) information with the data path exclusion flag set to "TRUE"(SP80).

Figure 39:
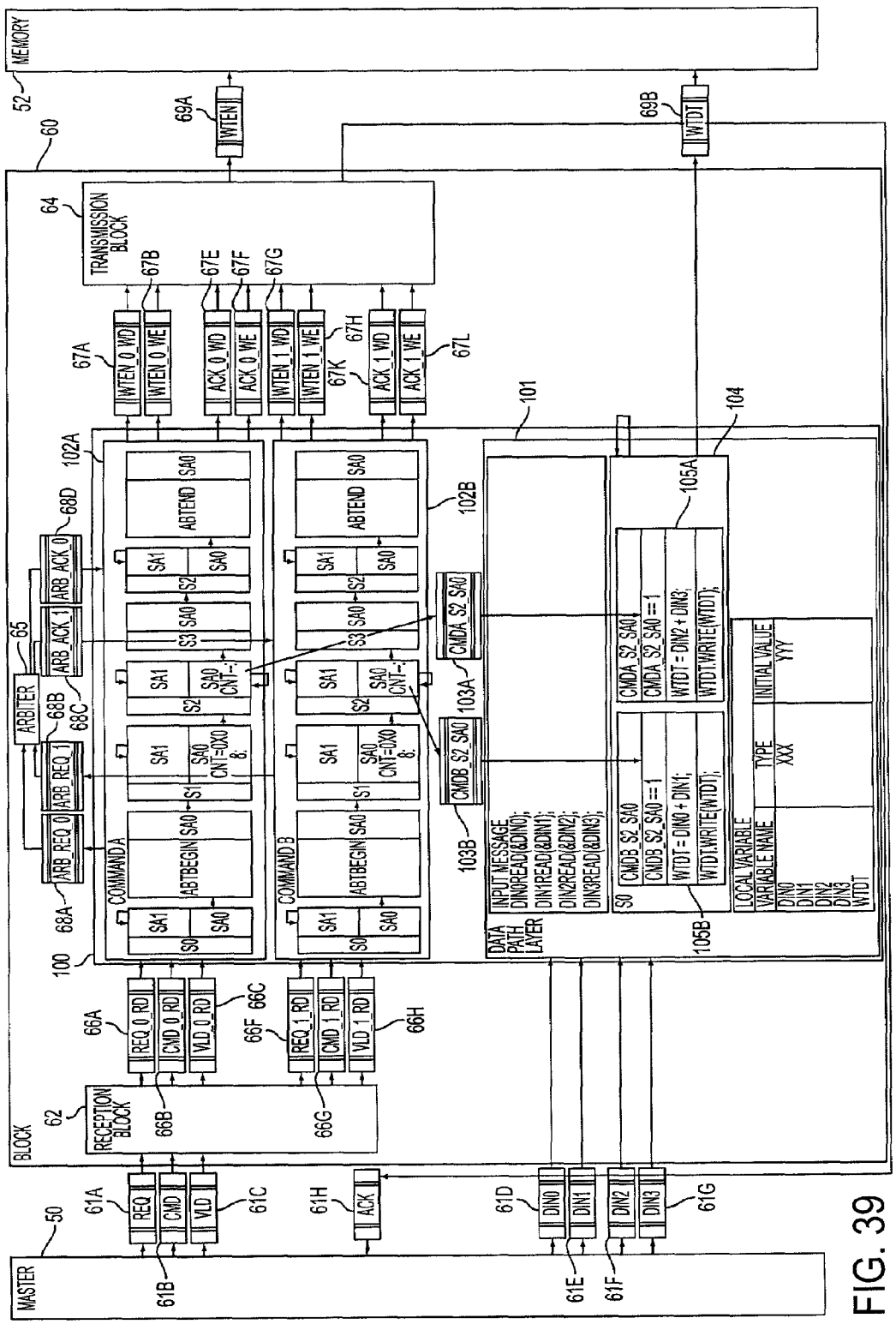
FIG. 39 is a conceptual diagram for the explanation of input message reconfiguration processing and output message reconfiguration processing.

The CPU 11 then changes the association of the input message extracted at step SP80 with the command layers to the association with the data path layer in the design database 18, as shown in FIG. 39 (SP81).

Figure 40:
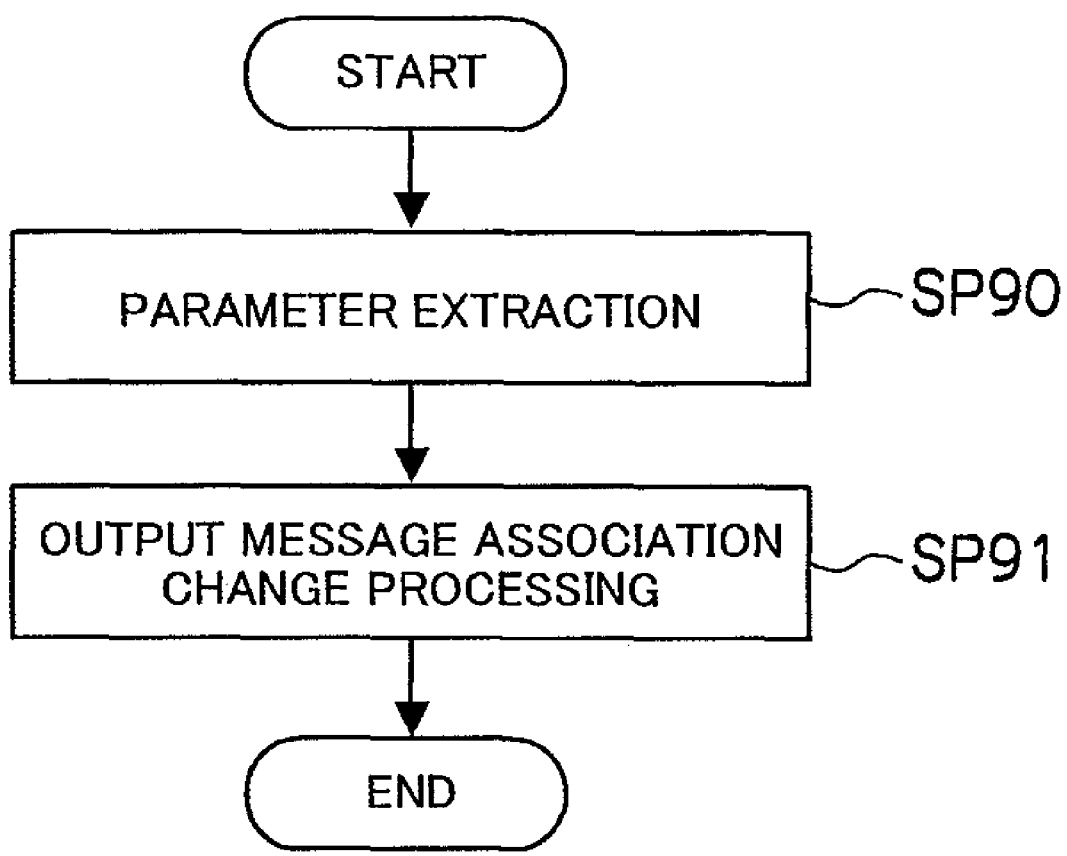
FIG. 40 is a flowchart for the explanation of output message reconfiguration processing.

FIG. 40 is a flowchart showing the specific content of the processing executed by the CPU 11 at step SP62 in FIG. 35.

When the CPU 11 proceeds to step SP62 in the data path layer creation processing, it starts the output message reconfiguration processing shown in FIG. 40. The CPU 11 first refers to the output message table 92 (FIG. 18), and extracts the record (output message) with the data path exclusion flat set to "TRUE"(SP90).

The CPU 11 then transfers the information about the output message extracted at step SP90 from the command layer to the data path layer in the design database 18, as shown in FIG. 39 (SP91).

Figure 41A:
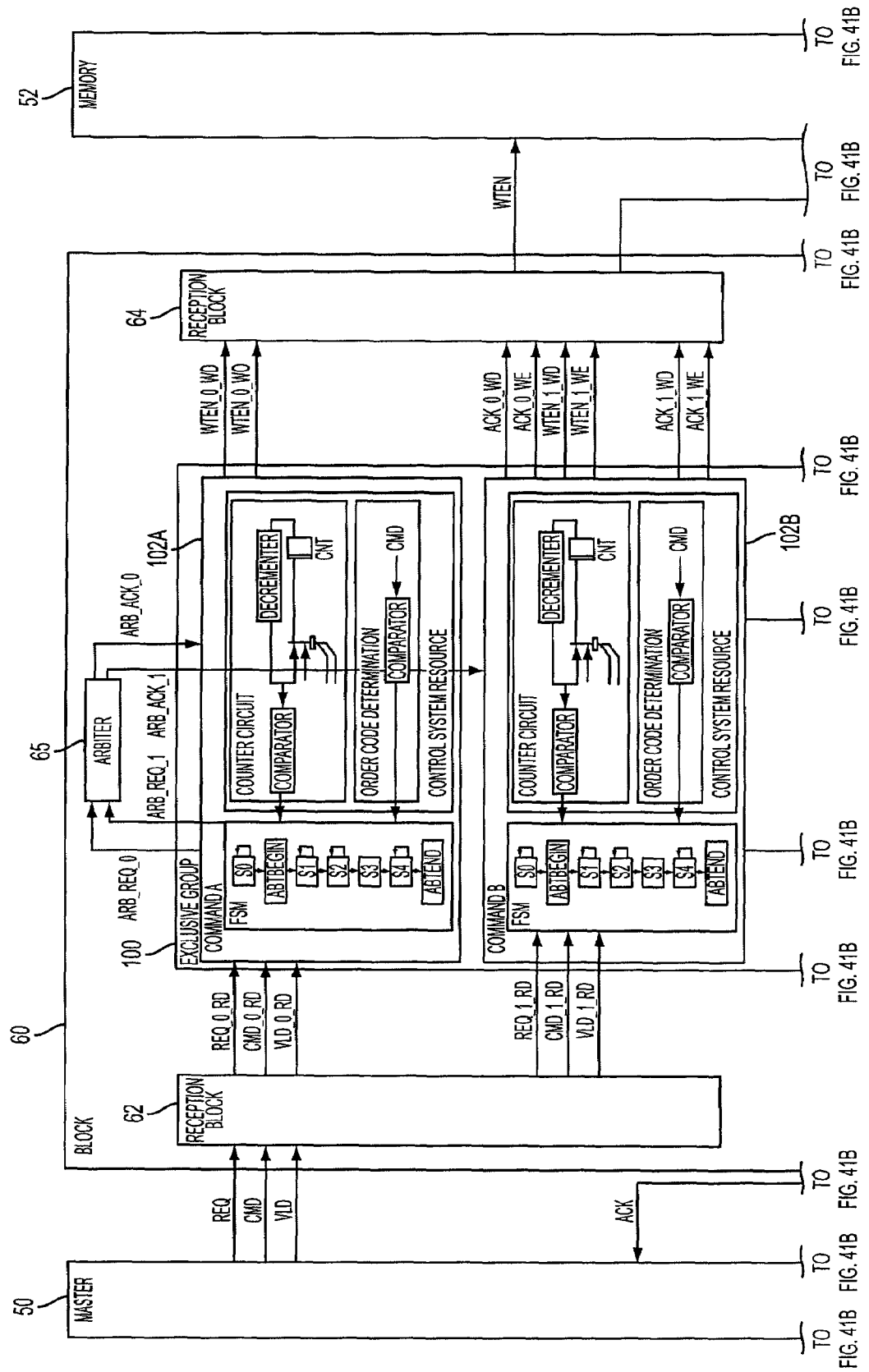

As a result of the above processing, the design database 18 shown in FIG. 39 is newly created. The HDL source code, which is described at the RTL, with the structure as shown in FIGS. 41A-B are created by subjecting the design database 18 to high-level synthesis.

(3) Effects of this Embodiment

As described above, in the LSI design apparatus 1 according to this embodiment, each of the commands 34 is separated into a control system behavior and a data system behavior in the preprocessing of high-level synthesis, and therefore, the control system resources such as the counter circuit and the comparator and the data system resources such as the data register, the address register, and the data calculator are separately designed. Accordingly, the readability and serviceability of the finally obtained circuit configuration are enhanced, enabling high-quality circuit design.

Also, in the LSI design apparatus 1 according to this embodiment, the data system behaviors for the commands 34, which have been separated from the control system behaviors as described above, are integrated into one behavior. Therefore, resource sharing in the data path logic can be performed over the plural states in high-level synthesis processing. Accordingly, the finally obtained circuit configuration can be reduced in scale dramatically.

(4) Other Embodiments

The above embodiment has been described for the case where this invention is utilized in the LSI design apparatus 1 appropriate for the LSI design for storage. However, the invention is not limited to this case, and a wide variety of other design apparatuses used for circuit design can be utilized in the invention.

Moreover, the above embodiment has been described for the case where the data path share program 14 and the CPU 11, which are configured as shown in FIG. 13, respectively constitute the command separation unit, in which commands described at a behavior level each are separated into a control system behavior and a data system behavior, and the integration unit, in which the data system behaviors for the commands are integrated. However, the invention is not limited to this case, and a wide variety of other configurations for the command separation unit and the integration unit can be utilized in the invention.

Furthermore, the above embodiment has been described for the case where the data system behaviors for the commands are integrated into one behavior. However, the invention is not limited to this case, and the data system behaviors may be integrated into plural, e.g., two or three, behaviors.

A wide variety of design apparatuses used for circuit design can be utilized in the invention.

What is claimed is:

1. A design apparatus for designing a circuit, comprising:
a command separation unit for separating plural commands described at a behavior level into control system behaviors that are behaviors concerning control and data system behaviors that are behaviors concerning data transfer:
an integration unit for integrating the data system behaviors for the commands into one or more behaviors;
a high-level synthesis processing unit for subjecting both of the control system behaviors for the commands and the behavior obtained by integrating the data system behaviors for the commands to high-level synthesis; and wherein the command separation unit separates the commands into the control system behaviors and the data system behaviors in accordance with a message attribute determination specification that has been set previously.

2. A design apparatus for designing a circuit, comprising:

a command separation unit for separating plural commands described at a behavior level into control system behaviors that are behaviors concerning control and data system behaviors that are behaviors concerning data transfer;

an integration unit for integrating the data system behaviors for the commands into one or more behaviors;

a high-level synthesis processing unit for subjecting both of the control system behaviors for the commands and the behavior obtained by integrating the data system behaviors for the commands to high-level synthesis; and wherein the command separation unit separates the commands into the control system behaviors and the data system behaviors in accordance with a processing node token and a transition condition node token that are respectively obtained by subjecting to lexical division a processing node that defines the content of processing to be executed by each of the commands and a transition condition node that is a conditional statement for having the command conduct state transition.

* * * * *